(12) United States Patent
Chou

(10) Patent No.: US 12,249,576 B2
(45) Date of Patent: Mar. 11, 2025

(54) SEMICONDUCTOR DEVICE STRUCTURE WITH STACKED CONDUCTIVE PLUGS AND METHOD FOR PREPARING THE SAME

(71) Applicant: NANYA TECHNOLOGY CORPORATION, New Taipei (TW)

(72) Inventor: Yi-Hsien Chou, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/635,378

(22) Filed: Apr. 15, 2024

(65) Prior Publication Data

US 2024/0258231 A1    Aug. 1, 2024

Related U.S. Application Data

(62) Division of application No. 17/541,587, filed on Dec. 3, 2021.

(51) Int. Cl.
| | |
|---|---|
| *H01L 21/768* | (2006.01) |
| *H01L 21/311* | (2006.01) |
| *H01L 23/522* | (2006.01) |
| *H01L 23/528* | (2006.01) |

(52) U.S. Cl.
CPC .... *H01L 23/5226* (2013.01); *H01L 21/31144* (2013.01); *H01L 21/76807* (2013.01); *H01L 21/76843* (2013.01); *H01L 21/76877* (2013.01); *H01L 23/5283* (2013.01)

(58) Field of Classification Search
CPC ......... H01L 21/31144; H01L 21/76807; H01L 21/76843; H01L 21/76877
See application file for complete search history.

(56) References Cited

U.S. PATENT DOCUMENTS

| | | | | |
|---|---|---|---|---|
| 6,153,517 | A | * | 11/2000 | Chuang ............. H01L 21/76849 438/657 |
| 2012/0289043 | A1 | | 11/2012 | Hsieh et al. |
| 2019/0304833 | A1 | | 10/2019 | Chen et al. |
| 2020/0035605 | A1 | * | 1/2020 | Tsai .................... H01L 23/5226 |
| 2021/0184038 | A1 | | 6/2021 | Lim et al. |

OTHER PUBLICATIONS

Office Action and and the search report mailed on May 9, 2024 related to U.S. Appl. No. 17/541,587, wherein this application is a DIV of U.S. Appl. No. 17/541,587.
Office Action and and the search report mailed on Oct. 22, 2024 related to U.S. Appl. No. 17/541,587, wherein this application is a DIV of U.S. Appl. No. 17/541,587.

* cited by examiner

*Primary Examiner* — Samuel A Gebremariam
(74) *Attorney, Agent, or Firm* — Xuan Zhang

(57) ABSTRACT

A semiconductor device structure includes a first dielectric layer disposed over a semiconductor substrate, and a second dielectric layer disposed over the first dielectric layer. The semiconductor device structure also includes a first conductive plug disposed in the first dielectric layer. A top surface of the first conductive plug is greater than a bottom surface of the first conductive plug. The semiconductor device structure further includes a second conductive plug disposed in the second dielectric layer and directly over the first conductive plug.

9 Claims, 27 Drawing Sheets

SEMICONDUCTOR DEVICE STRUCTURE WITH STACKED CONDUCTIVE PLUGS AND METHOD FOR PREPARING THE SAME

CROSS-REFERENCE TO RELATED APPLICATION

This application is a divisional application of U.S. Non-Provisional application Ser. No. 17/541,587 filed Dec. 3, 2021, which is incorporated herein by reference in its entirety.

TECHNICAL FIELD

The present disclosure relates to a semiconductor device structure and a method for preparing the same, and more particularly, to a semiconductor device structure with stacked conductive plugs and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a first conductive plug disposed in the first dielectric layer. A top surface of the first conductive plug is greater than a bottom surface of the first conductive plug. The semiconductor device structure further includes a second conductive plug disposed in the second dielectric layer and directly over the first conductive plug.

In an embodiment, an upper portion of the first conductive plug has lateral extension portions that protrude into the first dielectric layer. In an embodiment, the lateral extension portions of the upper portion of the first conductive plug are in direct contact with the second dielectric layer. In an embodiment, each of the lateral extension portions has a tapered width that is gradually tapered from the second dielectric layer to the semiconductor substrate. In an embodiment, the semiconductor device structure further includes a first liner separating the first conductive plug from the first dielectric layer and the semiconductor substrate. In an embodiment, the first liners are in direct contact with the second dielectric layer.

In an embodiment, the semiconductor device structure further includes a second liner separating the second conductive plug from the second dielectric layer and the first conductive plug. In an embodiment, the semiconductor device structure further includes a third conductive plug disposed in the first dielectric layer and penetrating through the second dielectric layer, wherein the first conductive plug and the second conductive plug are disposed in a pattern-dense region, and the third conductive plug is disposed in a pattern-loose region. In addition, the semiconductor device structure includes a third liner separating the third conductive plug from the semiconductor substrate, the first dielectric layer and the second dielectric layer.

In another embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a first conductive plug disposed in the first dielectric layer. An upper portion of the first conductive plug extends into the second dielectric layer. The semiconductor device structure further includes a silicide layer disposed in the second dielectric layer and covering a top surface and sidewalls of the upper portion of the first conductive plug, and a second conductive plug disposed in the second dielectric layer and directly over the first conductive plug and the silicide layer.

In an embodiment, the silicide layer is in direct contact with the first conductive plug. In an embodiment, the silicide layer is in direct contact with the first dielectric layer. In an embodiment, the semiconductor device structure further includes a first liner separating the first conductive plug from the first dielectric layer and the semiconductor substrate. In an embodiment, the first liner extends between the silicide layer and the sidewalls of the upper portion of the first conductive plug. In an embodiment, the semiconductor device structure further includes a second liner separating the second conductive plug from the second dielectric layer and the silicide layer.

In an embodiment, the second liner is in direct contact with the silicide layer. In an embodiment, the semiconductor device structure further includes a third conductive plug disposed in the first dielectric layer and penetrating through the second dielectric layer, wherein the first conductive plug, the silicide layer and the second conductive plug are disposed in a pattern-dense region, and the third conductive plug is disposed in a pattern-loose region. In addition, the semiconductor device structure includes a third liner separating the third conductive plug from the semiconductor substrate, the first dielectric layer and the second dielectric layer.

In another embodiment of the present disclosure, a method for preparing a semiconductor device structure is provided. The method includes forming a first dielectric layer over a semiconductor substrate, and etching the first dielectric layer to form a first opening exposing the semiconductor substrate. The method also includes forming recesses by removing portions of the first dielectric layer at top corners of the first opening, and forming a first conductive plug in the first opening and the recesses. The method further includes forming a second dielectric layer over the first dielectric layer, and etching the second dielectric layer to form a second opening exposing the first conductive plug. In addition, the method includes forming a second conductive plug in the second opening.

In an embodiment, the step of forming the recesses further includes forming a patterned mask over the first dielectric layer, wherein the first opening and a top surface of the first dielectric layer around the first opening are exposed by the patterned mask. In addition, the step of forming the recesses includes etching the first dielectric layer using the patterned mask as a mask such that recesses are formed connected to the first opening. In an embodiment, the first conductive plug has lateral extension portions formed in the recesses, and each of the lateral extension portions has a tapered width that is gradually tapered from the second dielectric layer to the semiconductor substrate. In an embodiment, at least a portion of the lateral extension portions of the first conductive plug is covered by the second dielectric layer after the second opening is formed.

In an embodiment, the method further includes forming a first liner lining the recesses and the first opening, and forming the first conductive plug over the first liner. In an embodiment, the method further includes forming a second liner lining the second opening, and forming the second conducive plug over the second liner, wherein the second conducive plug is separated from the first conductive plug and the second dielectric layer by the second liner. In an embodiment, the method further includes forming a third opening penetrating through the first dielectric layer and the second dielectric layer, and forming a third liner lining the third opening. In addition, the method includes forming a third conductive plug in the third opening and over the third liner, wherein the first conductive plug and the second conductive plug are formed in a pattern-dense region, and the third conductive plug is formed in a pattern-loose region.

In yet another embodiment of the present disclosure, a method for preparing a semiconductor device structure is provided. The method includes forming a first dielectric layer over a semiconductor substrate, and etching the first dielectric layer to form a first opening exposing the semiconductor substrate. The method also includes forming a first conductive plug in the first opening, and etching the first dielectric layer such that an upper portion of the first conductive plug protrudes from a top surface of the first dielectric layer. The method further includes forming a silicide layer covering a top surface and sidewalls of the upper portion of the first conductive plug, and forming a second dielectric layer over the first dielectric layer. In addition, the method includes etching the second dielectric layer to form a second opening exposing the silicide layer, and forming a second conductive plug in the second opening.

In an embodiment, the step of forming the silicide layer further includes depositing a polysilicon layer conformally covering the first dielectric layer and the upper portion of the first conductive plug, and performing a thermal treatment process to transform a portion of the polysilicon layer into the silicide layer. In an embodiment, the method further includes removing a remaining portion of the polysilicon layer after the thermal treatment process is performed. In an embodiment, at least a portion of the silicide layer is covered by the second dielectric layer after the second opening is formed. In an embodiment, the method further includes forming a first liner lining the first opening, and forming the first conductive plug over the first liner.

In an embodiment, the method further includes forming a second liner lining the second opening, and forming the second conductive plug over the second liner, wherein the second conductive plug is separated from the silicide layer and the second dielectric layer by the second liner. In an embodiment, the method further includes forming a third opening penetrating through the first dielectric layer and the second dielectric layer, and forming a third liner lining the third opening. In addition, the method includes forming a third conductive plug in the third opening and over the third liner, wherein the first conductive plug and the second conductive plug are formed in a pattern-dense region, and the third conductive plug is formed in a pattern-loose region.

Embodiments of a semiconductor device structure and method for preparing the same are provided in the disclosure. In some embodiments, the semiconductor device structure includes a first conductive plug and a second conductive plug directly over the first conductive plug, and a top surface of the first conductive plug is greater than a bottom surface of the first conductive plug. The aforementioned stacked conductive plugs can help to eliminate the problems of having overhang resulting from the difficulties in filling a high aspect ratio opening structure.

Moreover, the greater top surface of the first conductive plug increases the landing area for the second conductive plug. Therefore, the possibility of gap formation between the conductive plugs and the surrounding dielectric layers can be reduced, and the risk of misalignment between the first conductive plug and the second conductive plug can be prevented. As a result, the performance, reliability and yield of the semiconductor device structure can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
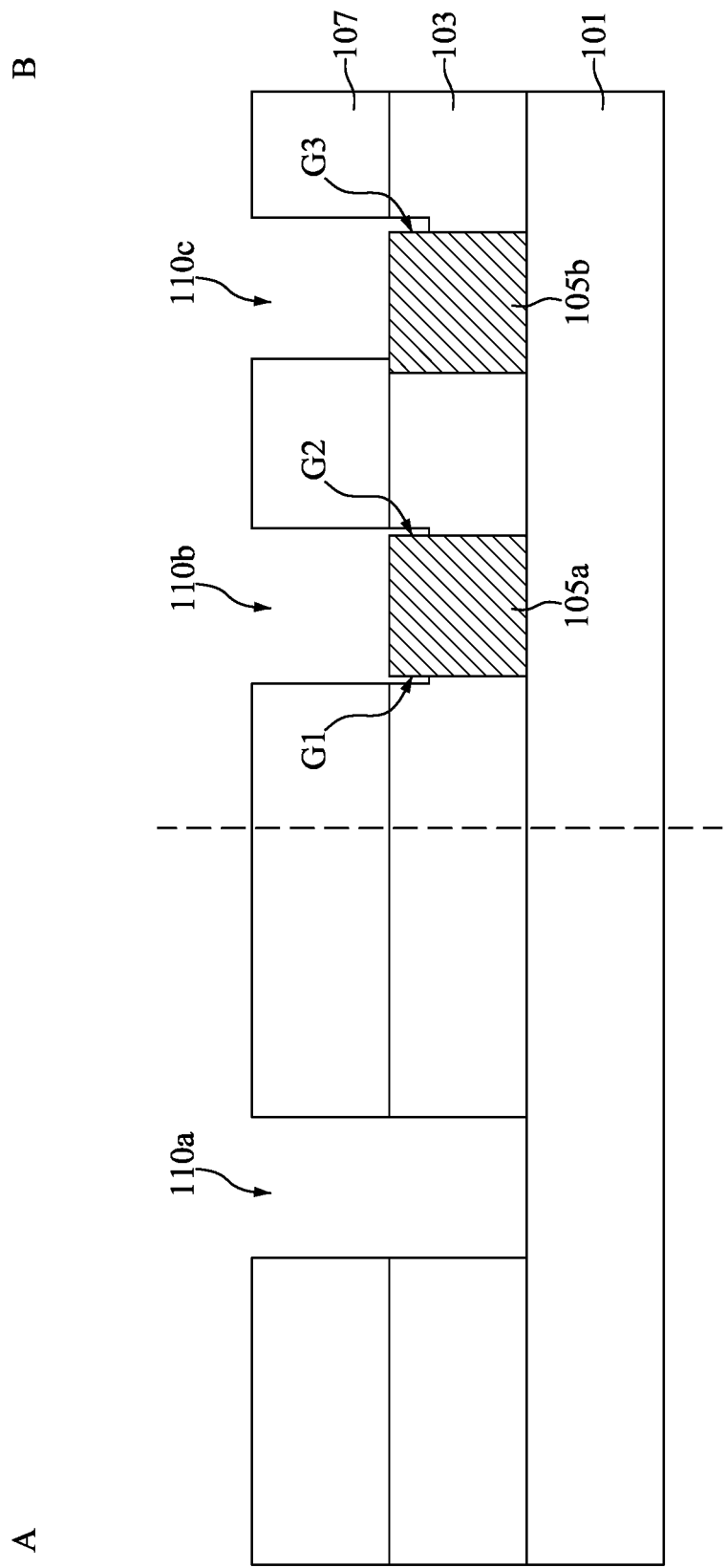
FIG. 1 is a cross-sectional view illustrating an intermediate stage of a process for forming a semiconductor device structure according to a comparative example.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
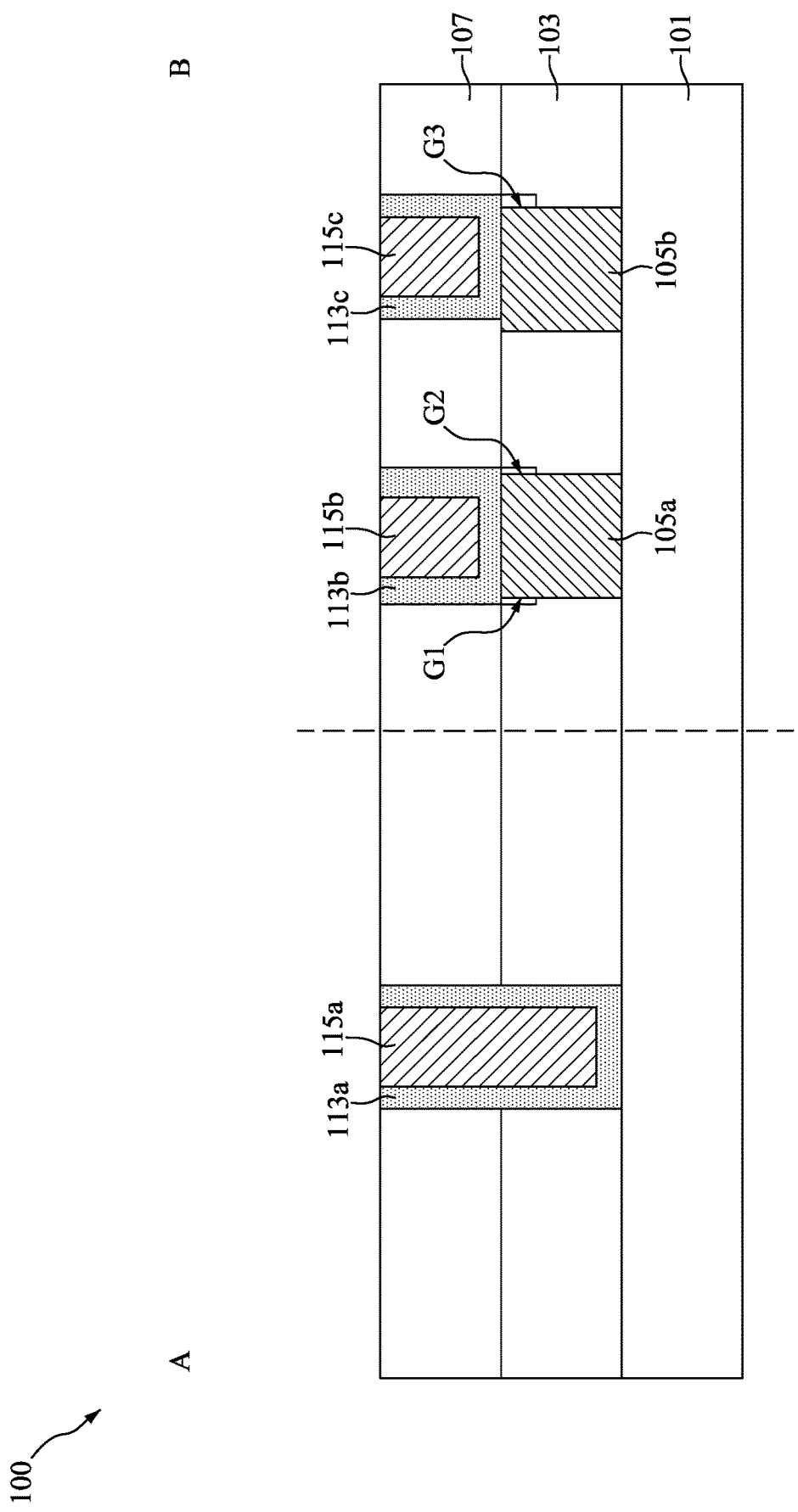
FIG. 2 is a cross-sectional view illustrating a semiconductor device structure according to a comparative example.

FIGS. 1 and 2 are cross-sectional views illustrating intermediate stages of a process for forming a semiconductor device structure 100 according to a comparative example. In this comparative example, a semiconductor substrate 101 is provided, a first dielectric layer 103 and conductive plugs 105a, 105b surrounding by the first dielectric layer 103 are disposed over the semiconductor substrate 101, and a second dielectric layer 107 is disposed over the first dielectric layer 103.

Moreover, the structure of FIG. 1 has a pattern-loose region A (i.e., array region) and a pattern-dense region B (i.e., peripheral circuit region). An opening 110a penetrating through the first dielectric layer 103 and the second dielectric layer 107 is located in the pattern-loose region A, and openings 110b and 110c penetrating through the second dielectric layer 107 are located in the pattern-dense region B. In order to clarify the disclosure, the dotted line in the middle of FIG. 1 is used to indicate the boundary of the pattern-loose region A and the pattern-dense region B.

During the process for forming the openings 110a, 110b and 110c, some level of misalignment may occur due to a variety of overlay alignments shift defect in the photolithography process, which leads to the formation of gaps G1, G2 and G3 around the conductive plugs 105a and 105b, as shown in FIG. 1. Then, as shown in FIG. 2, liners 113a, 113b, 113c and conductive plugs 115a, 115b, 115c are formed in the openings 110a, 110b, 110c. The gaps G1, G2 and G3 are small enough such that the gaps G1, G2 and G3 are sealed in the semiconductor device structure 100 which can degrade device performance.

Figure 3:
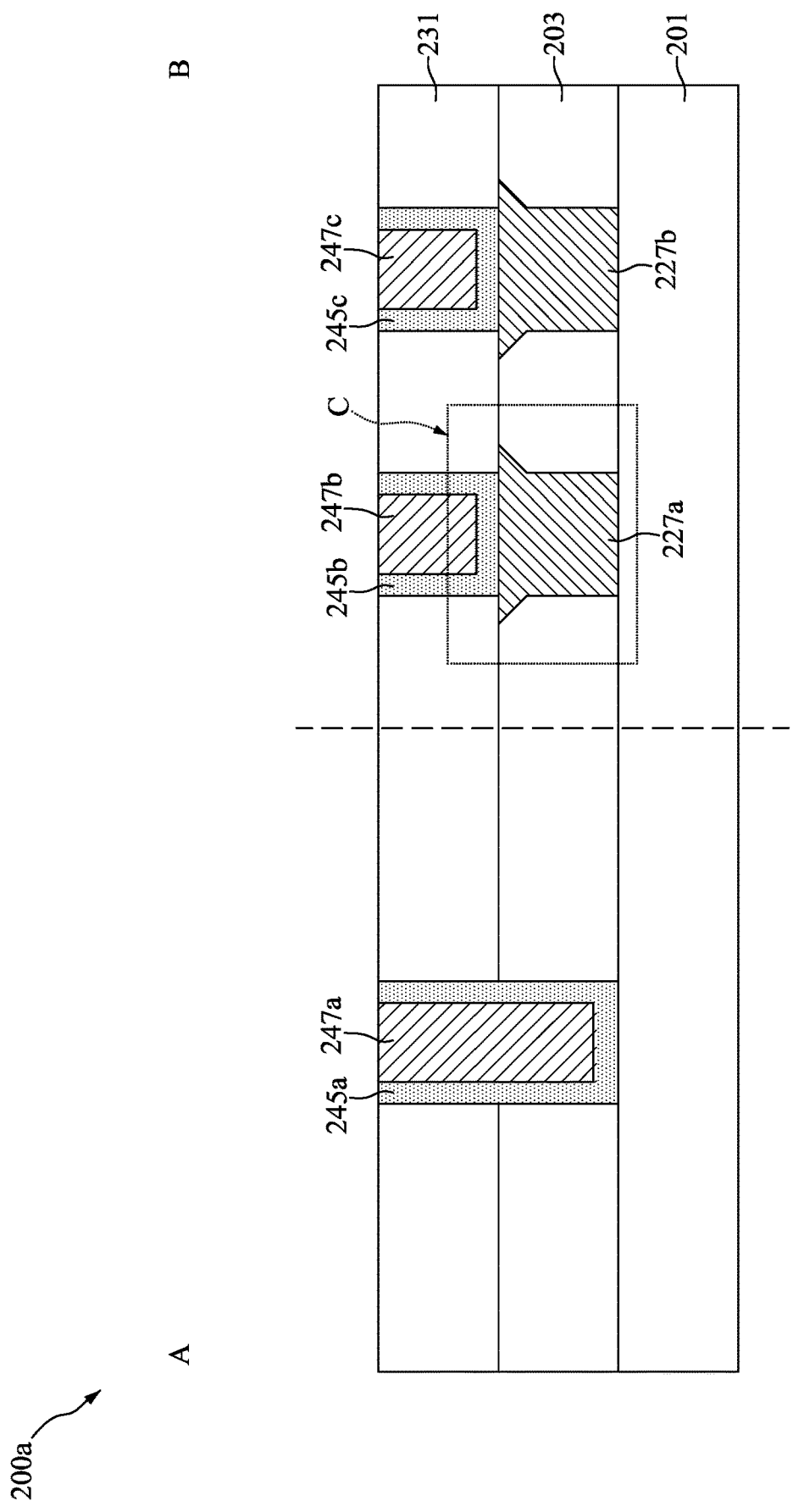
FIG. 3 is a cross-sectional view illustrating a semiconductor device structure according to various embodiments of the present disclosure.
Figure 4:
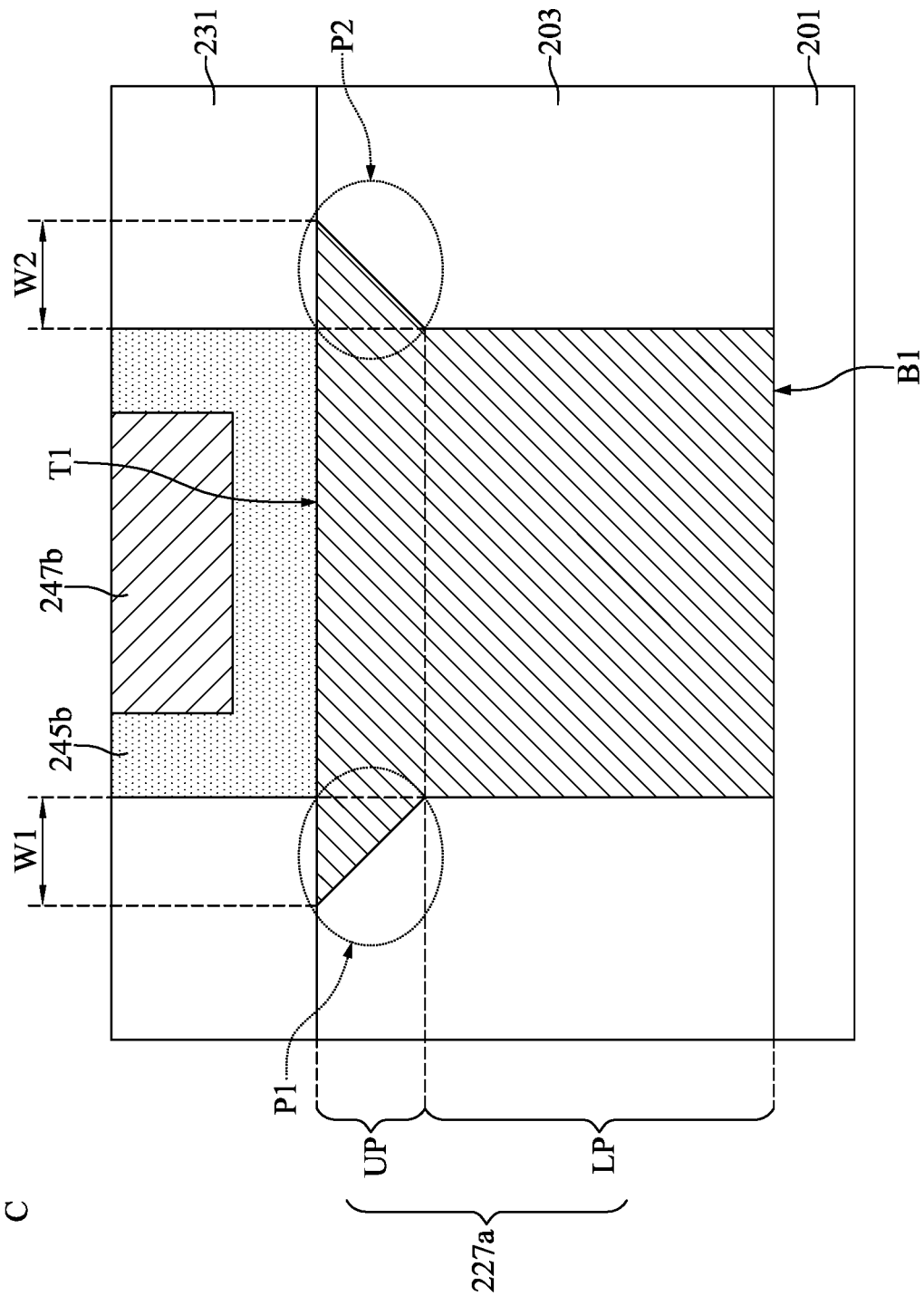
FIG. 4 is a partial enlargement view illustrating a portion of the structure shown in FIG. 3 according to various embodiments of the present disclosure.

FIG. 3 is a cross-sectional view illustrating a semiconductor device structure 200a, and FIG. 4 is a partial enlargement view illustrating the portion C of the semiconductor device structure 200a shown in FIG. 3 according to various embodiments of the present disclosure. As shown in FIG. 3, the semiconductor device structure 200a includes a semiconductor substrate 201, a first dielectric layer 203 disposed over the semiconductor substrate 201, and a second dielectric layer 231 disposed over the first dielectric layer 203, in accordance with some embodiments.

In some embodiments, the semiconductor device structure 200a has a pattern-loose region A and a pattern-dense region B. In the pattern loose region A, the semiconductor device structure 200a includes a liner 245a and a conductive plug 247a surrounded by the first dielectric layer 203 and the second dielectric layer 231. In some embodiments, the conductive plug 247a is disposed in the first dielectric layer 203 and penetrating through the second dielectric layer 231. In some embodiments, the bottom surface and the sidewalls of the conductive plug 247a are covered by the liner 245a, such that the conductive plug 247a is separated from the semiconductor substrate 201, the first dielectric layer 203 and the second dielectric layer 231 by the liner 245a.

In the pattern-dense region B, the semiconductor device structure 200a includes conductive plugs 227a and 227b disposed in the first dielectric layer 203, and liners 245b, 245c and conductive plugs 247b, 247c disposed in the second dielectric layer 231. In some embodiments, the liner 245b and the conductive plug 247b are disposed directly over the conductive plug 227a, and the liner 245c and the conductive plug 247c are disposed directly over the conductive plug 227b. In some embodiments, the bottom surface and the sidewalls of the conductive plug 247b are covered by the liner 245b, such that the conductive plug 247b is separated from the conductive plug 227a and the second dielectric layer 231 by the liner 245b.

Moreover, in some embodiments, the bottom surface and the sidewalls of the conductive plug 247c are covered by the liner 245c, such that the conductive plug 247c is separated from the conductive plug 227b and the second dielectric layer 231 by the liner 245c. In some embodiments, the conductive plug 247b is electrically connected to the conductive plug 227a through the liner 245b, and the conductive plug 247c is electrically connected to the conductive plug 227b through the liner 245c.

Each of the conductive plugs 227a and 227b includes an upper portion and a lower portion (e.g., the upper portion UP and the lower portion LP of the conductive plug 227a in FIG. 4), and each of the upper portions of the conductive plugs 227a and 227b has lateral extension portions that protrude into the first dielectric layer 203, such as the lateral extension portions P1 and P2 shown in FIG. 4 in accordance with some embodiments. In some embodiments, the top surface T1 of the conductive plug 227a is greater than the bottom surface B1 of the conductive plug 227a due to existence of the lateral extension portions P1 and P2.

In some embodiments, the lateral extension portion P1 of the conductive plug 227a has a tapered width W1 that is gradually tapered from the second dielectric layer 231 to the semiconductor substrate 201, and the lateral extension portion P2 of the conductive plug 227a has a tapered width W2 that is gradually tapered from the second dielectric layer 231 to the semiconductor substrate 201. Although the details of the conductive plug 227b are not illustrated, it is understood that similar features can be formed in the conductive plug 227b.

Figure 5:
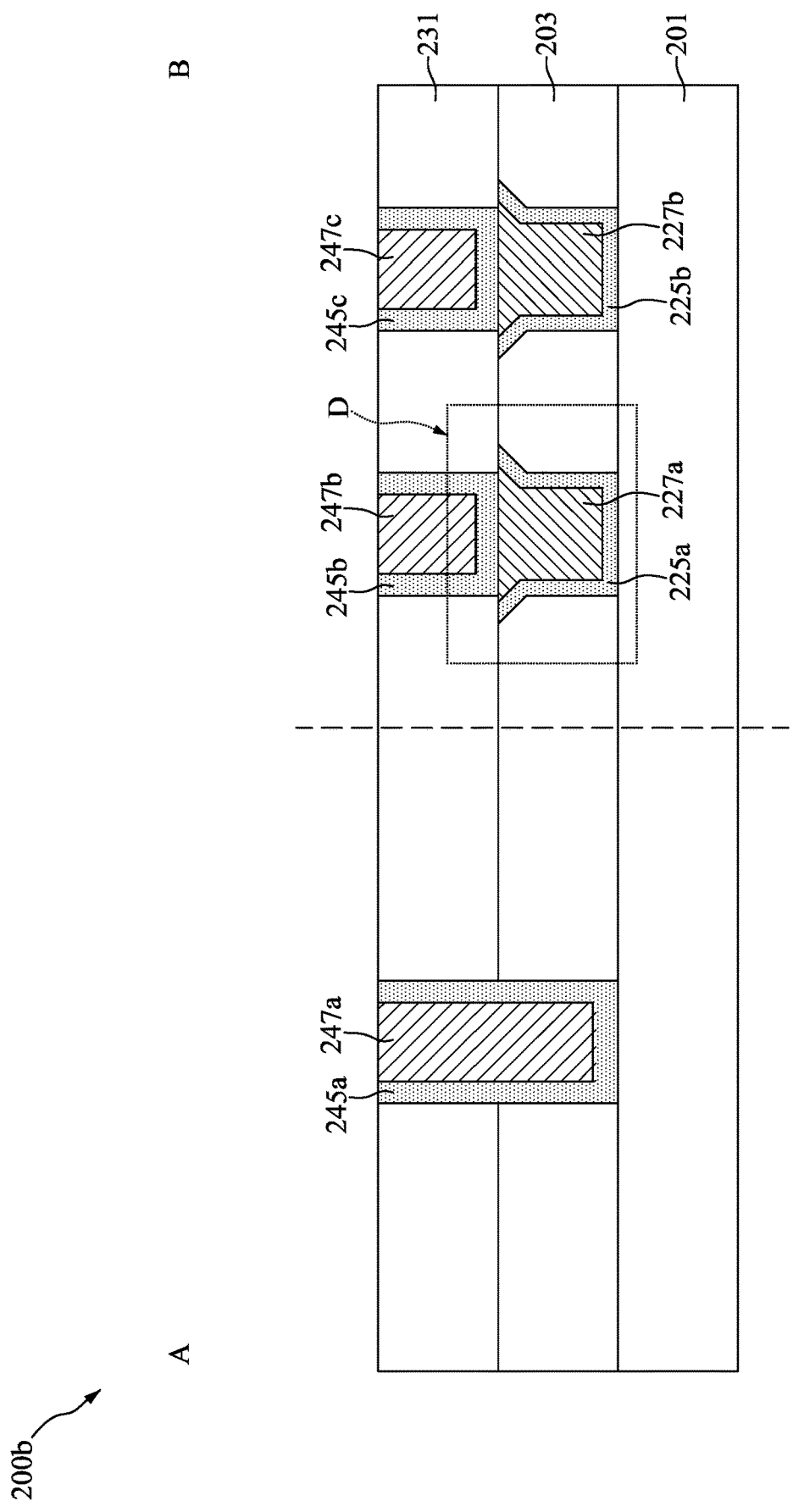
FIG. 5 is a cross-sectional view illustrating a semiconductor device structure according to various embodiments of the present disclosure.
Figure 6:
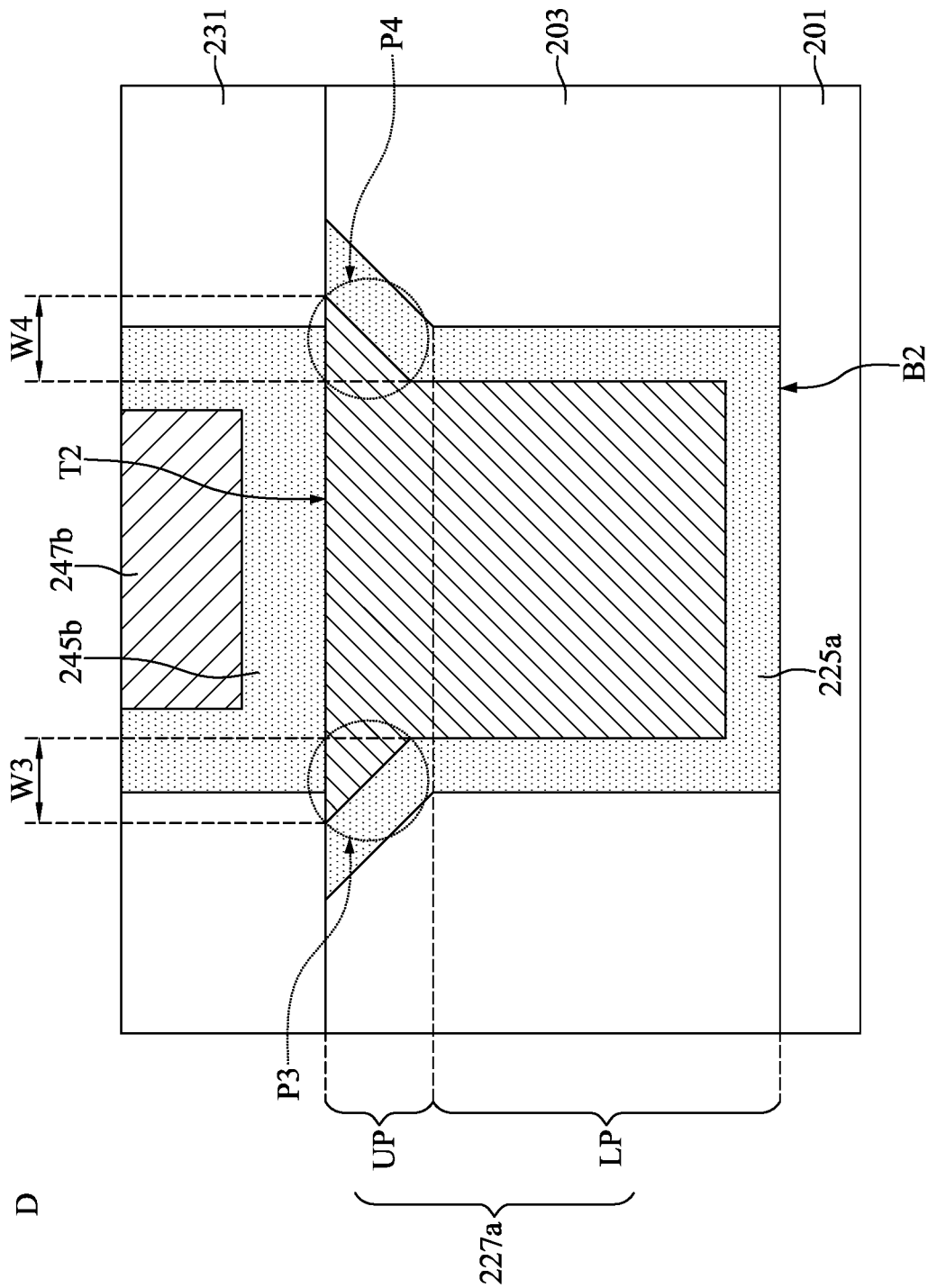
FIG. 6 is a partial enlargement view illustrating a portion of the structure shown in FIG. 5 according to various embodiments of the present disclosure.

FIG. 5 is a cross-sectional view illustrating a semiconductor device structure 200b, and FIG. 6 is a partial enlargement view illustrating the portion D of the semiconductor device structure 200b shown in FIG. 5 according to various embodiments of the present disclosure. The semiconductor device structure 200b is similar to the semiconductor device 200a. However, in the semiconductor device 200b, additional liners 225a and 225b are disposed in the pattern-dense region B, in accordance with some embodiments.

In some embodiments, the bottom surface and the sidewalls of the conductive plug 227a are covered by the liner 225a, such that the conductive plug 227a is separated from the first dielectric layer 203 and the semiconductor substrate 201 by the liner 225a. Moreover, in some embodiments, the bottom surface and the sidewalls of the conductive plug 227b are covered by the liner 225b, such that the conductive plug 227b is separated from the first dielectric layer 203 and the semiconductor substrate 201 by the liner 225b.

Similar to the conductive plugs 227a and 227b in the semiconductor device structure 200a, each of the conductive plugs 227a and 227b in the semiconductor device structure 200b includes an upper portion and a lower portion (e.g., the upper portion UP and the lower portion LP of the conductive plug 227a in FIG. 6), and each of the upper portions of the conductive plugs 227a and 227b has lateral extension portions that protrude into the first dielectric layer 203, such as the lateral extension portions P3 and P4 shown in FIG. 6 in accordance with some embodiments. As shown in FIG. 6, the top surface T2 of the conductive plug 227a is greater than the bottom surface B2 of the conductive plug 227a due to the existence of the lateral extension portions P3 and P4, in accordance with some embodiments.

Furthermore, the lateral extension portion P3 of the conductive plug 227a has a tapered width W3 that is gradually tapered from the second dielectric layer 231 to the semiconductor substrate 201, and the lateral extension portion P4 of the conductive plug 227a has a tapered width W4 that is gradually tapered from the second dielectric layer 231 to the semiconductor substrate 201, as shown in FIG. 6 in accordance with some embodiments. Although the details of the conductive plug 227b in the semiconductor device structure 200b are not illustrated, it is understood that similar features can be formed in the conductive plug 227b.

Figure 7:
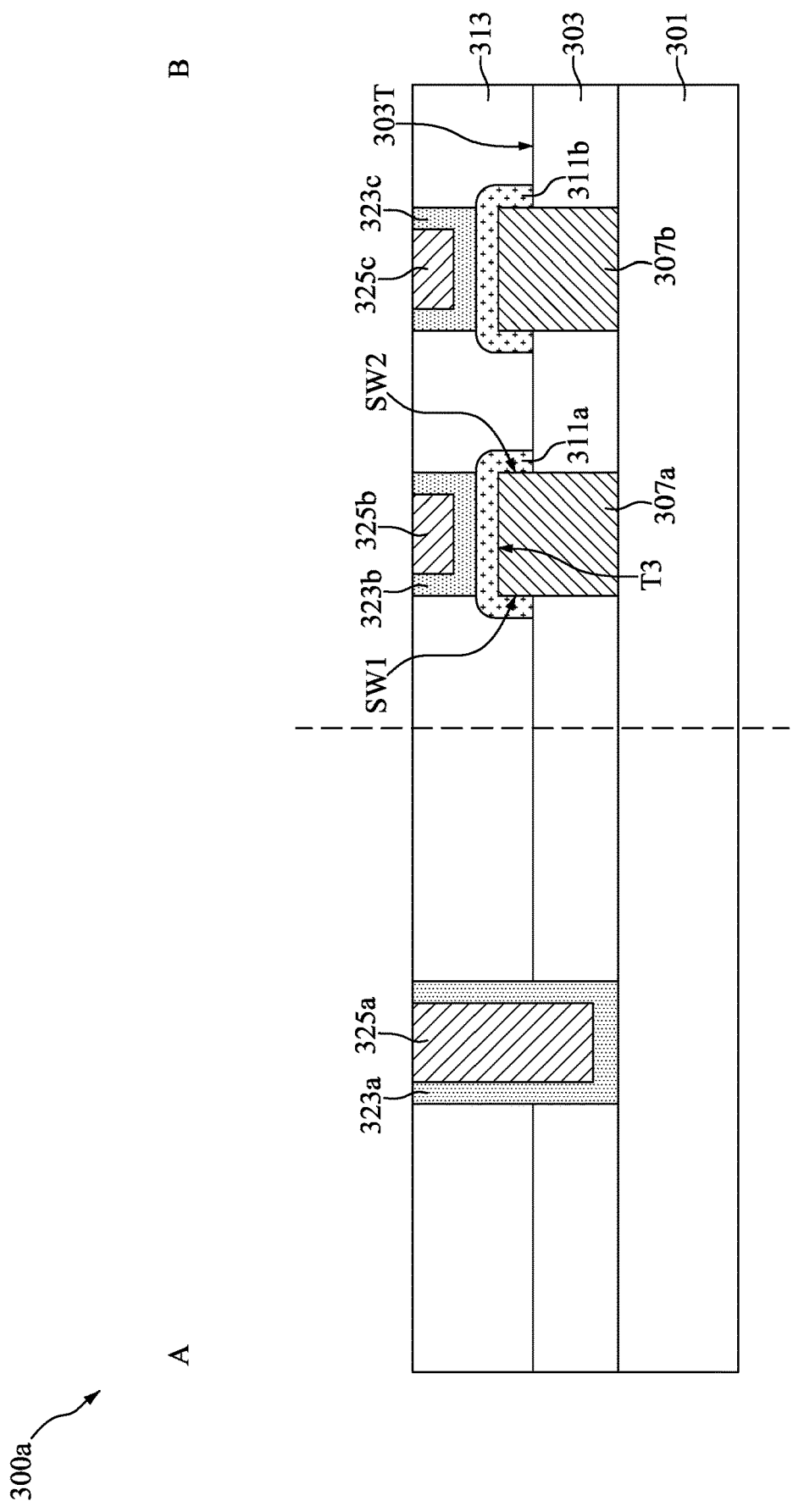
FIG. 7 is a cross-sectional view illustrating a semiconductor device structure according to various embodiments of the present disclosure.

FIG. 7 is a cross-sectional view illustrating a semiconductor device structure 300a according to various embodiments of the present disclosure. As shown in FIG. 7, the semiconductor device structure 300a includes a semiconductor substrate 301, a first dielectric layer 303 disposed over the semiconductor substrate 301, and a second dielectric layer 313 disposed over the first dielectric layer 303, in accordance with some embodiments.

In some embodiments, the semiconductor device structure 300a has a pattern-loose region A and a pattern-dense region B. In the pattern loose region A, the semiconductor device structure 300a includes a liner 323a and a conductive plug 325a surrounded by the first dielectric layer 303 and the second dielectric layer 313. In some embodiments, the conductive plug 325a is disposed in the first dielectric layer 303 and penetrating through the second dielectric layer 313. In some embodiments, the bottom surface and the sidewalls of the conductive plug 325a are covered by the liner 323a, such that the conductive plug 325a is separated from the semiconductor substrate 301, the first dielectric layer 303 and the second dielectric layer 313 by the liner 323a.

In the pattern-dense region B, the semiconductor device structure 300a includes conductive plugs 307a and 307b disposed in the first dielectric layer 303, and the upper portions of the conductive plugs 307a and 307b extend into the second dielectric layer 313. In some embodiments, the semiconductor device structure 300a also includes silicide layers 311a and 311b covering the upper portions of the conductive plugs 307a and 307b, respectively. It should be noted that the silicide layers 311a and 311b are disconnected from each other.

In some embodiments, the top surface and the sidewalls of the upper portion of the conductive plug 307a above the top surface 303T of the first dielectric layer 303 (e.g., the top surface T3 and the sidewalls SW1, SW2) are covered by the silicide layer 311a, and the top surface and the sidewalls of the upper portion of the conductive plug 307b above the top surface 303T of the first dielectric layer 303 are covered by the silicide layer 311b.

In addition, the semiconductor device structure 300a includes liners 323b, 323c and conductive plugs 325b, 325c disposed in the second dielectric layer 313. In some embodiments, the liner 323b and the conductive plug 325b are disposed directly over the conductive plug 307a and the silicide layer 311a, and the liner 323c and the conductive plug 325c are disposed directly over the conductive plug 307b and the silicide layer 311b. In some embodiments, the bottom surface and the sidewalls of the conductive plug 325b are covered by the liner 323b, such that the conductive plug 325b is separated from the silicide layer 311a and the second dielectric layer 313 by the liner 323b.

Moreover, in some embodiments, the bottom surface and the sidewalls of the conductive plug 325c are covered by the liner 323c, such that the conductive plug 325c is separated from the silicide layer 311b and the second dielectric layer 313 by the liner 323c. In some embodiments, the conductive plug 325b is electrically connected to the conductive plug 307a through the liner 323b and the silicide layer 311a, and the conductive plug 325c is electrically connected to the conductive plug 307b through the liner 323c and the silicide layer 311b. In some embodiments, the silicide layers 311a and 311b are in direct contact with the first dielectric layer 303, and the conductive plugs 307a and 307b are separated from the second dielectric layer 313 by the silicide layers 311a and 311b.

Figure 8:
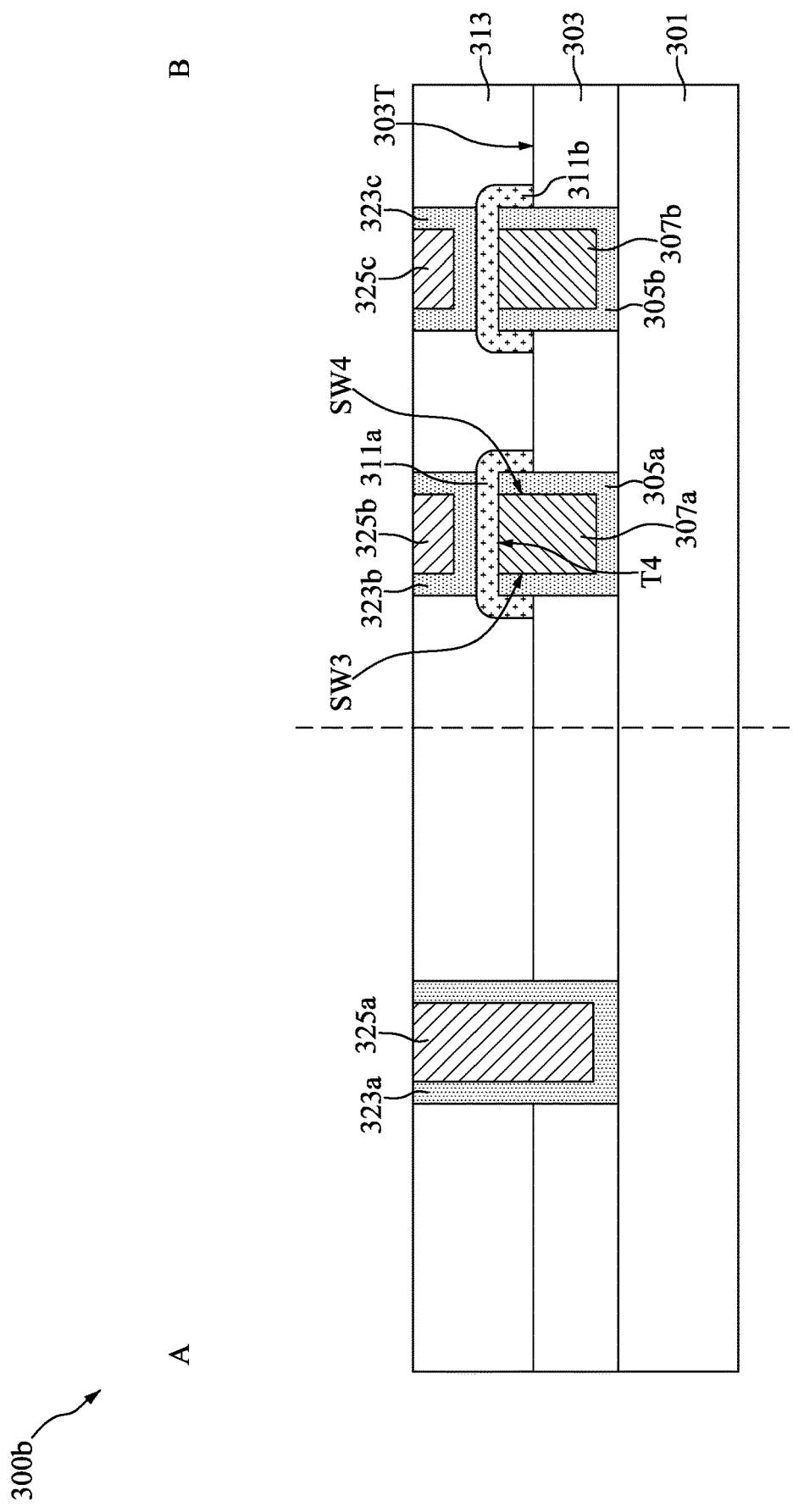
FIG. 8 is a cross-sectional view illustrating a semiconductor device structure according to various embodiments of the present disclosure.

FIG. 8 is a cross-sectional view illustrating a semiconductor device structure 300b according to various embodiments of the present disclosure. The semiconductor device structure 300b is similar to the semiconductor device 300a. For example, the top surface and the sidewalls of the upper portion of the conductive plug 307a above the top surface 303T of the first dielectric layer 303 (e.g., the top surface T4 and the sidewalls SW3, SW4) are covered by the silicide layer 311a, and the top surface and the sidewalls of the upper portion of the conductive plug 307b above the top surface 303T of the first dielectric layer 303 are covered by the silicide layer 311b.

However, in the semiconductor device 300b, additional liners 305a and 305b are disposed in the pattern-dense region B, in accordance with some embodiments. In some embodiments, the bottom surface and the sidewalls of the conductive plug 307a are covered by the liner 305a, such that the conductive plug 307a is separated from the first dielectric layer 303 and the semiconductor substrate 301 by the liner 305a. Moreover, in some embodiments, the bottom surface and the sidewalls of the conductive plug 307b are covered by the liner 305b, such that the conductive plug 307b is separated from the first dielectric layer 303 and the semiconductor substrate 301 by the liner 305b.

Furthermore, the liner 305a extends between the silicide layer 311a and the sidewalls SW3, SW4 of the upper portion of the conductive plug 307a above the top surface 303T of the first dielectric layer 303, and the liner 305b extends between the silicide layer 311b and the sidewalls of the upper portion of the conductive plug 307b above the top surface 303T of the first dielectric layer 303, in accordance with some embodiments.

In some embodiments, the semiconductor device structures 200a, 200b, 300a and 300b are dynamic random access memories (DRAM). In these cases, the conductive plugs 227a, 227b, 247a, 247b, 247c, 307a, 307b, 325a, 325b and 325c can serve as bit line (BL) contact plugs, capacitor contact plugs and/or interconnect structures which provide vertical electrical conduction pathways in the DRAM structures.

Figure 9:
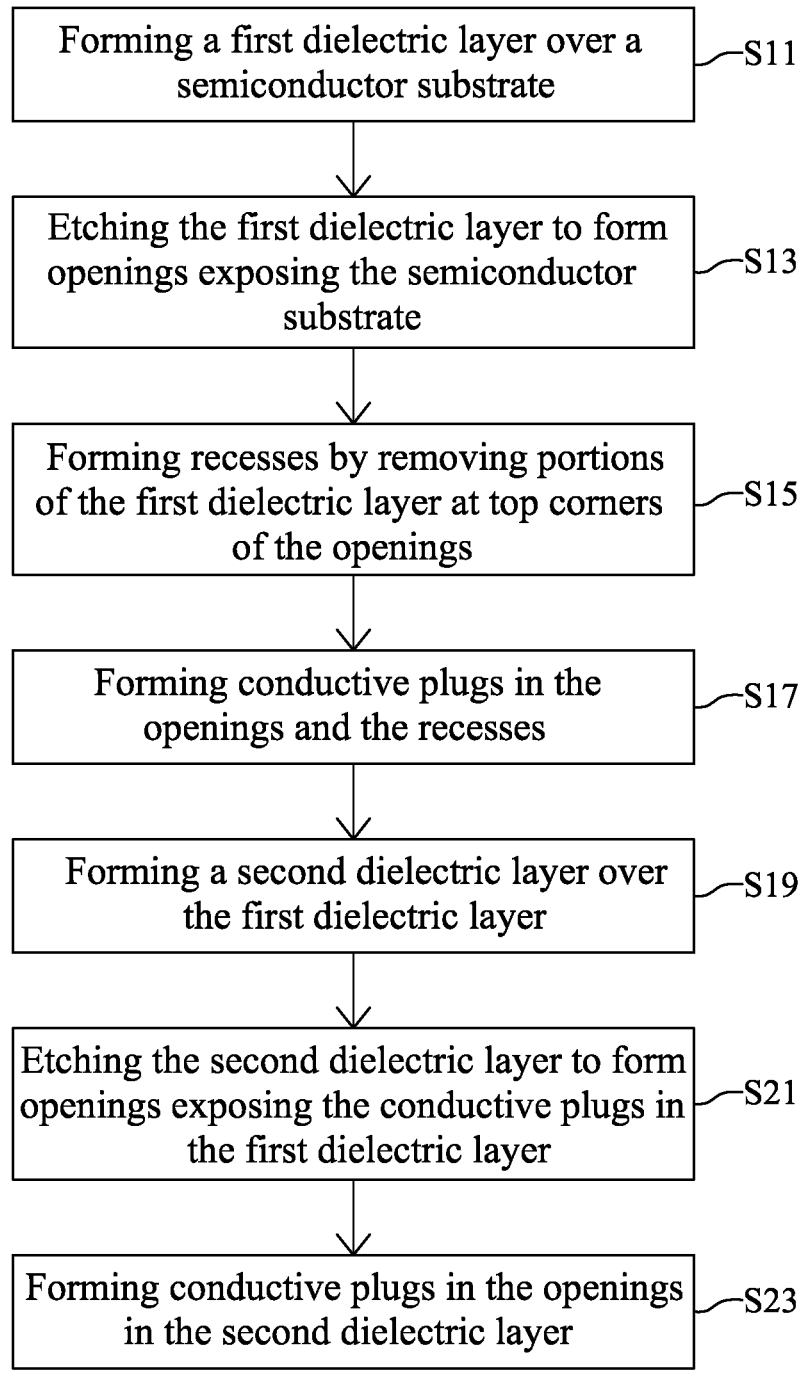
FIG. 9 is a flow diagram illustrating a method for preparing a semiconductor device structure according to various embodiments of the present disclosure.

FIG. 9 is a flow diagram illustrating a method 10 for preparing a semiconductor device structure (e.g., the semiconductor device structures 200a and 200b), and the method 10 includes steps S11, S13, S15, S17, S19, S21 and S23, in accordance with some embodiments. The steps S11 to S23 of FIG. 9 are elaborated in connection with the following figures, such as FIGS. 11-20.

Figure 10:
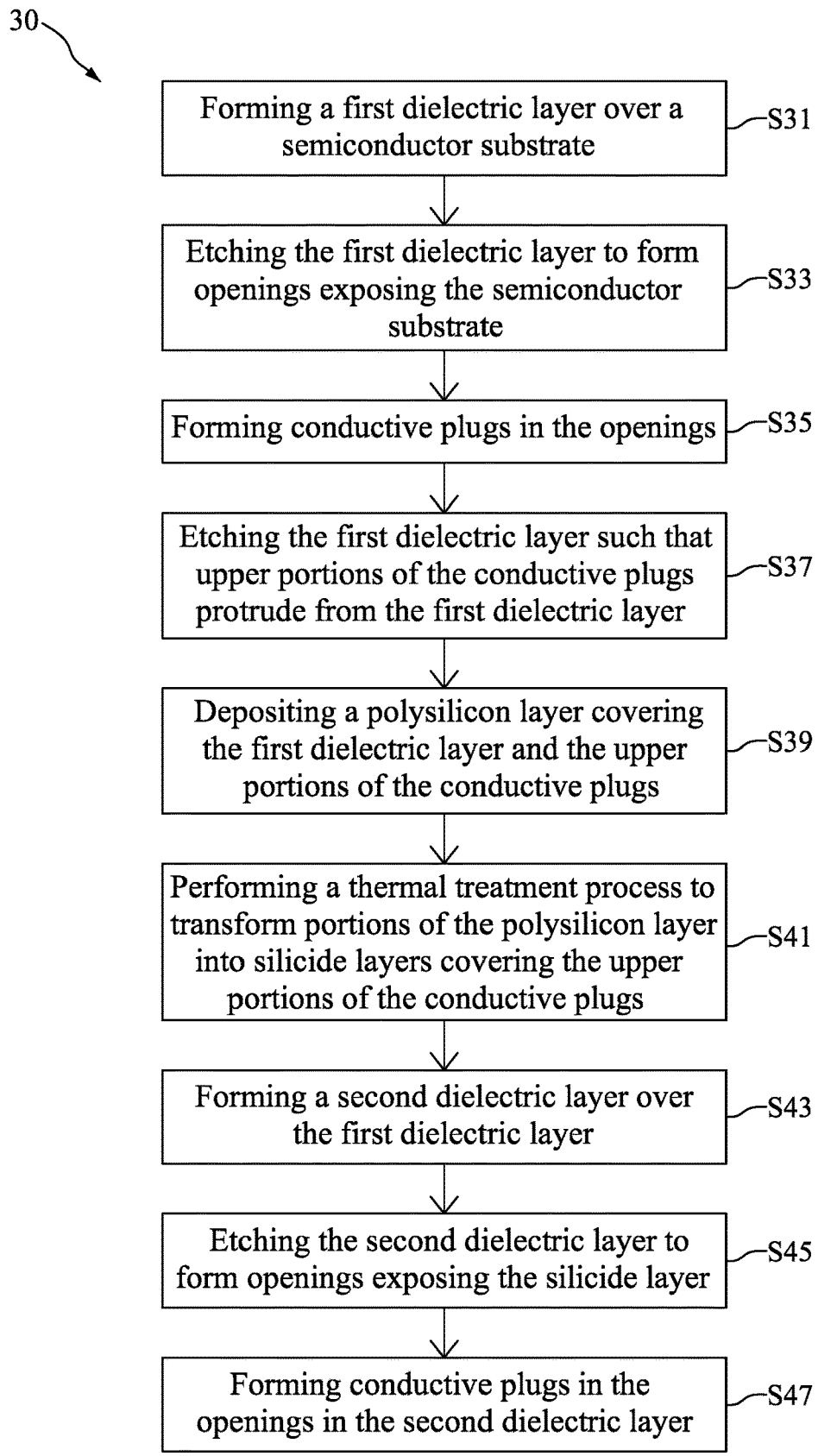
FIG. 10 is a flow diagram illustrating a method for preparing a semiconductor device structure according to various embodiments of the present disclosure.

FIG. 10 is a flow diagram illustrating a method 30 for preparing a semiconductor device structure (e.g., the semiconductor device structures 300a and 300b), and the method 30 includes steps S31, S33, S35, S37, S39, S41, S43, S45 and S47, in accordance with some embodiments. The steps S31 to S47 of FIG. 10 are elaborated in connection with the following figures, such as FIGS. 21-26.

Figure 11:
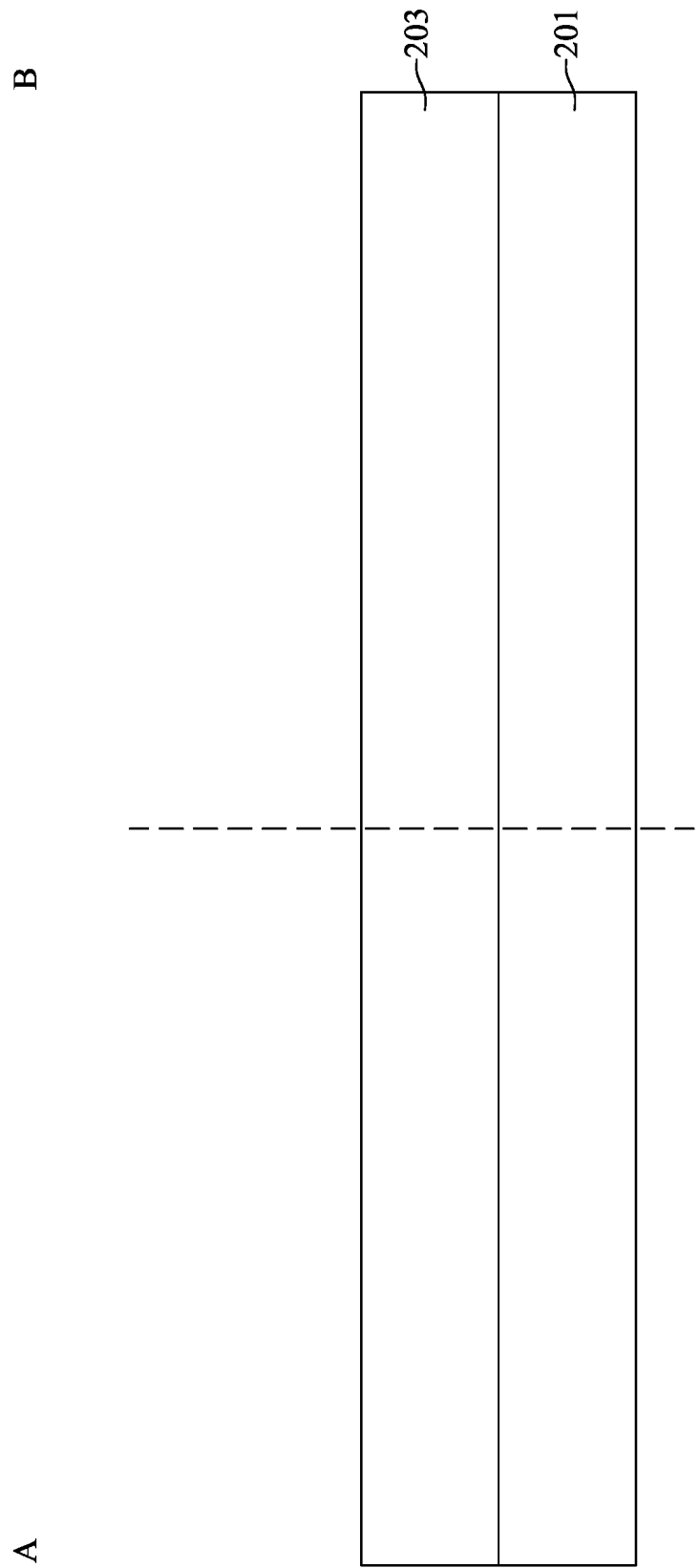
FIG. 11 is a cross-sectional view illustrating an intermediate stage of forming a first dielectric layer over a semiconductor substrate during the formation of the semiconductor device structure according to various embodiments of the present disclosure.

FIGS. 11-20 are cross-sectional views illustrating intermediate stages of forming the semiconductor device structure 200a, in accordance with some embodiments. As shown in FIG. 11, a semiconductor substrate 201 is provided. The semiconductor substrate 201 may be a semiconductor wafer such as a silicon wafer.

Alternatively or additionally, the semiconductor substrate 201 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 201 includes an epitaxial layer. For example, the semiconductor substrate 201 has an epitaxial layer overlying a bulk semiconductor. In some embodiments, the semiconductor substrate 201 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

A first dielectric layer 203 is formed over the semiconductor substrate 201, as shown in FIG. 11 in accordance with some embodiments. The respective step is illustrated as the step S11 in the method 10 shown in FIG. 9. In some embodiments, the first dielectric layer 203 is made of silicon oxide, silicon nitride, silicon oxynitride, a low-k dielectric material or another suitable material. The first dielectric layer 203 may be formed by a deposition process, such as a chemical vapor deposition (CVD) process, a physical vapor deposition (PVD) process, an atomic layer deposition (ALD) process, a spin-on coating process, or another suitable method.

Figure 12:
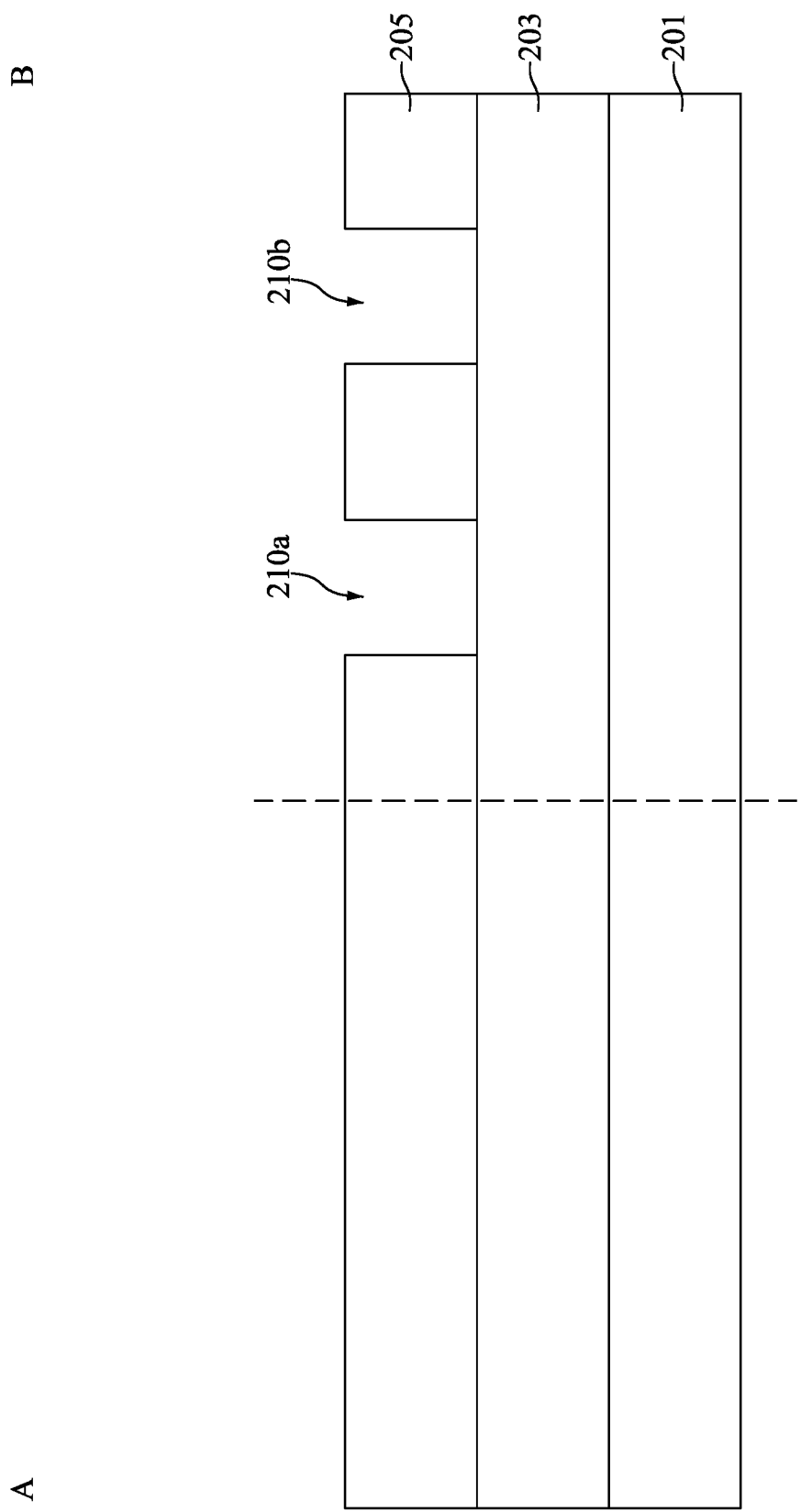
FIG. 12 is a cross-sectional view illustrating an intermediate stage of forming a patterned mask over the first dielectric layer during the formation of the semiconductor device structure according to various embodiments of the present disclosure.

Subsequently, a patterned mask 205 with openings 210a and 210b is formed over the first dielectric layer 203, as shown in FIG. 12 in accordance with some embodiments. In some embodiments, the openings 210a and 210b are located in the pattern-dense region B, such that the portion of the first dielectric layer 203 in the pattern-dense region B is partially exposed by the openings 210a and 210b. In some embodiments, the portion of the first dielectric layer 203 in the pattern-loose region A is entirely covered by the patterned mask 205.

Figure 13:
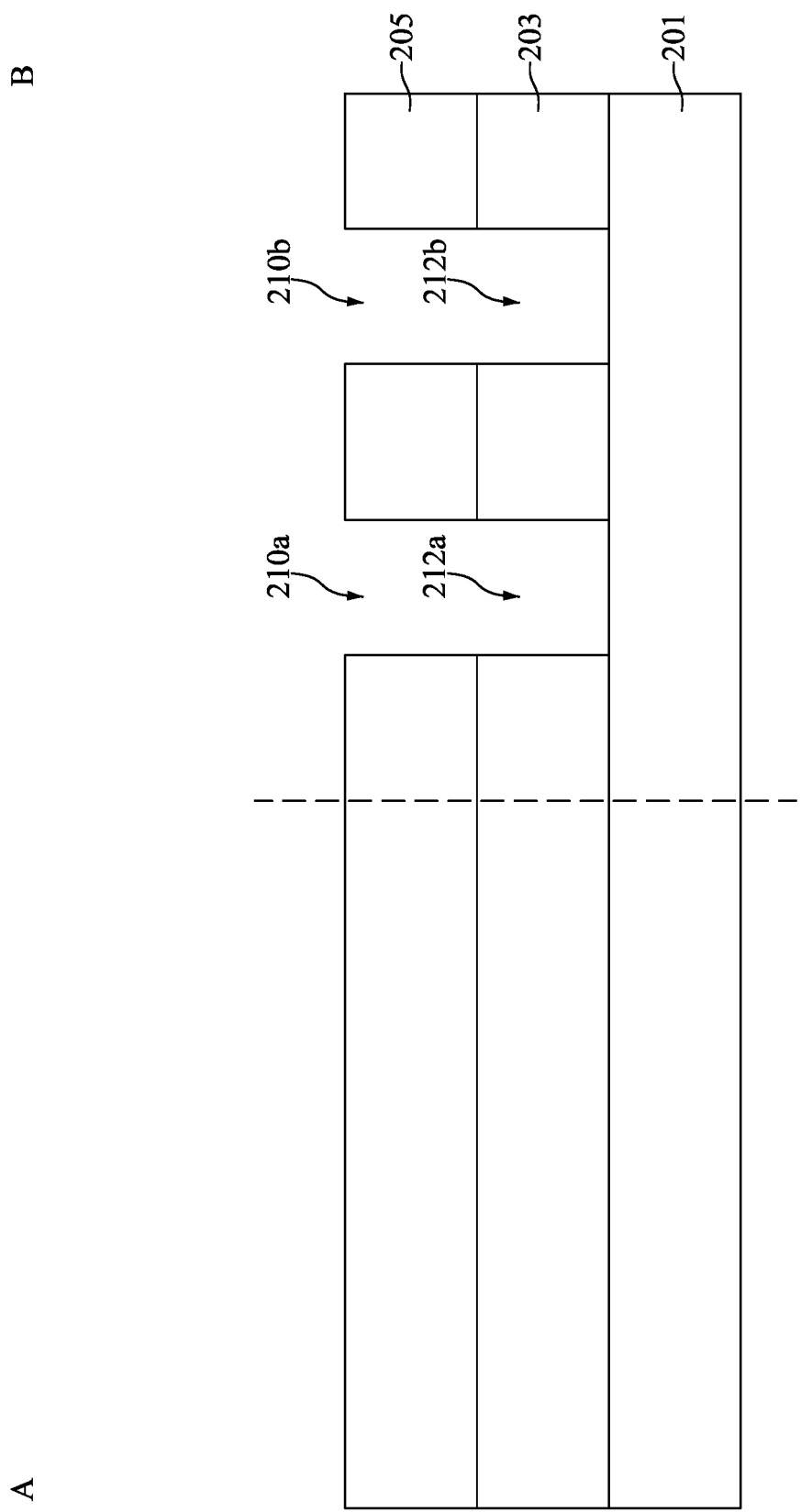
FIG. 13 is a cross-sectional view illustrating an intermediate stage of etching the first dielectric layer to form openings exposing the semiconductor substrate during the formation of the semiconductor device structure according to various embodiments of the present disclosure.

Then, an etching process is performed on the first dielectric layer 203 using the patterned mask 205 as a mask, such that openings 212a and 212b are formed in the first dielectric layer 203, as shown in FIG. 13 in accordance with some embodiments. In some embodiments, the openings 212a and 212b penetrate through the first dielectric layer 203, such that the semiconductor substrate 201 is exposed. The respective step is illustrated as the step S13 in the method 10 shown in FIG. 9. The etching process may be a wet etching process, a dry etching process, and a combination thereof. After the openings 212a and 212b are formed, the patterned mask 205 may be removed.

Figure 14:
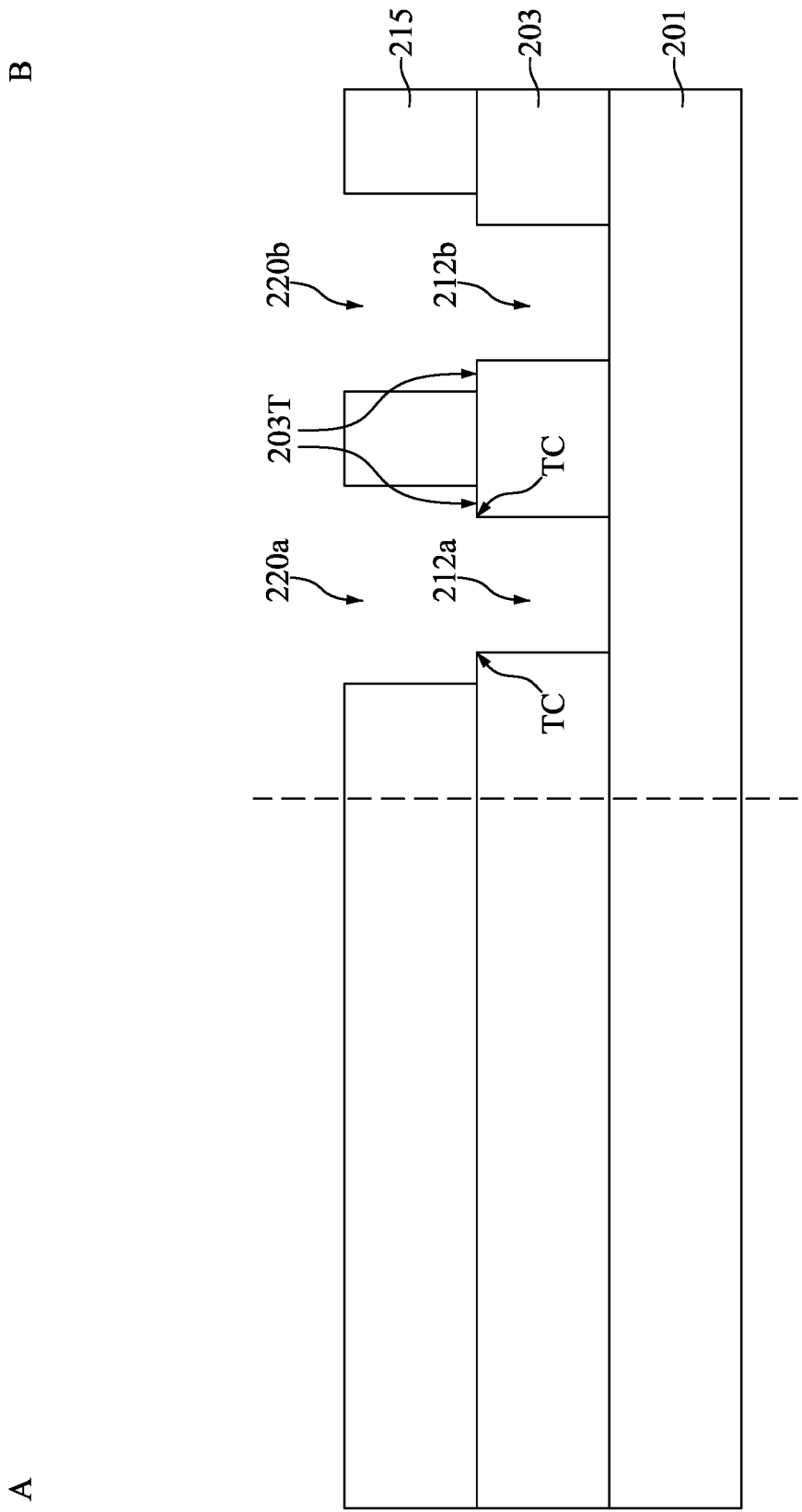
FIG. 14 is a cross-sectional view illustrating an intermediate stage of forming a patterned mask over the etched first dielectric layer during the formation of the semiconductor device structure according to various embodiments of the present disclosure.

Next, a patterned mask 215 with openings 220a and 220b is formed over the first dielectric layer 203, as shown in FIG. 14 in accordance with some embodiments. In some embodiments, the openings 220a and 220b of the patterned mask 215 are located in the pattern-dense region B. In some embodiments, the openings 212a and 212b in the first dielectric layer 203 and a top surface 203T of the first dielectric layer 203 around the openings 212a and 212b are exposed by the openings 220a and 220b of the patterned mask 215.

In some embodiments, the top corners TC of the first dielectric layer 203 in the openings 212a and 212b are exposed. In other words, the widths of the openings 220a and 220b are greater than the widths of the openings 212a and 212b. In some embodiments, the portion of the first dielectric layer 203 in the pattern-loose region A is entirely covered by the patterned mask 215.

Figure 15:
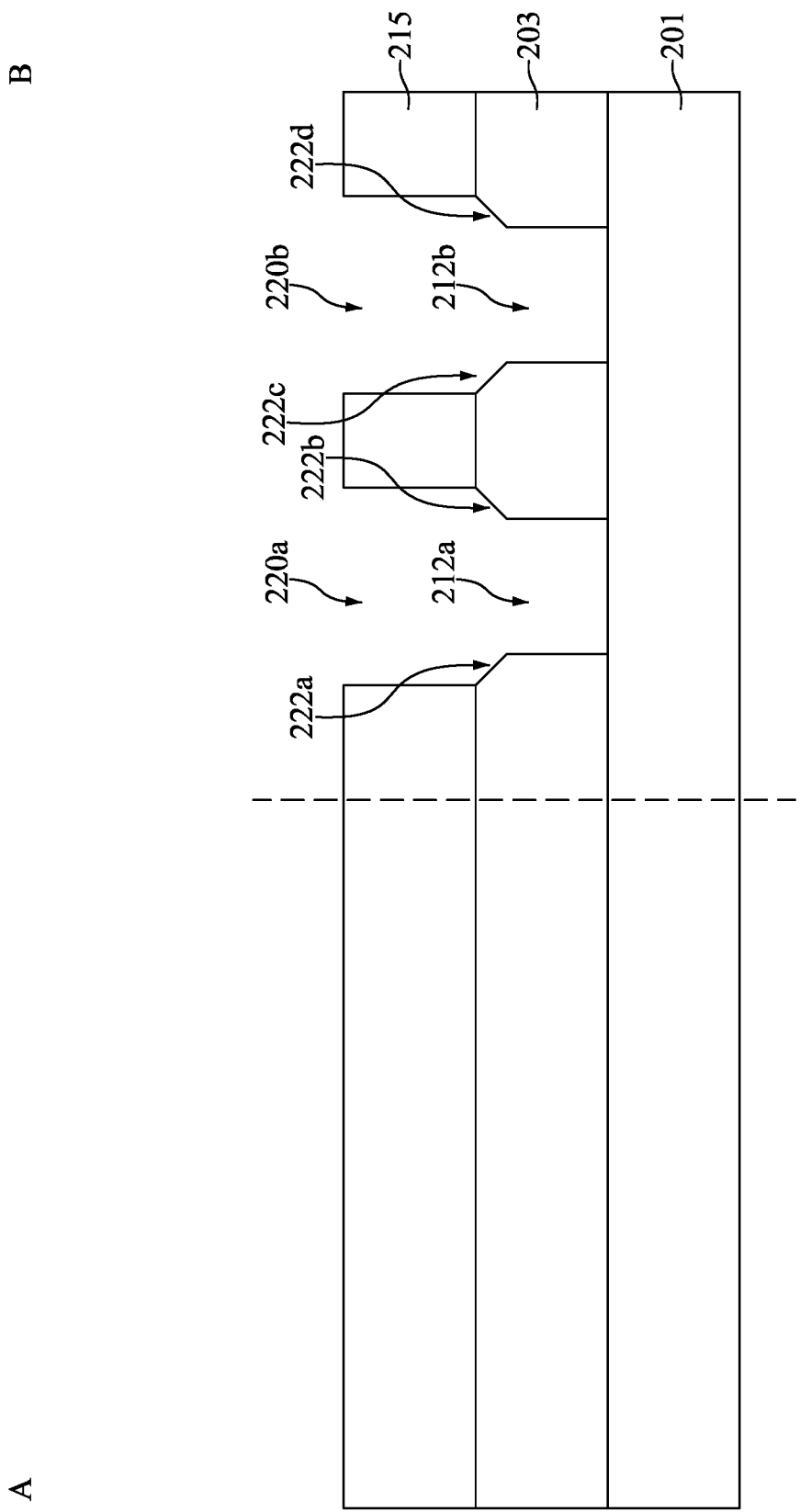
FIG. 15 is a cross-sectional view illustrating an intermediate stage of forming recesses by removing portions of the first dielectric layer at top corners of the openings during the formation of the semiconductor device structure according to various embodiments of the present disclosure.

Subsequently, an etching process is performed on the first dielectric layer 203 using the patterned mask 215 as a mask, and the etching process removes portions of the first dielectric layer 203 at the top corners TC of the openings 212a and 212b to form recesses 222a, 222b, 222c and 222d, as shown in FIG. 15 in accordance with some embodiments. In some embodiments, the top widths of the openings 212a and 212b are enlarged (i.e., corner rounding). The respective step is illustrated as the step S15 in the method 10 shown in FIG. 9.

In some embodiments, the recesses 222a and 222b are formed on opposite sides of the opening 212a, and the recesses 222c and 222d are formed on opposite sides of the opening 212b. The etching process may be a wet etching process, a dry etching process, and a combination thereof. After the recesses 222a-222d are formed, the patterned mask 215 may be removed.

Figure 16:
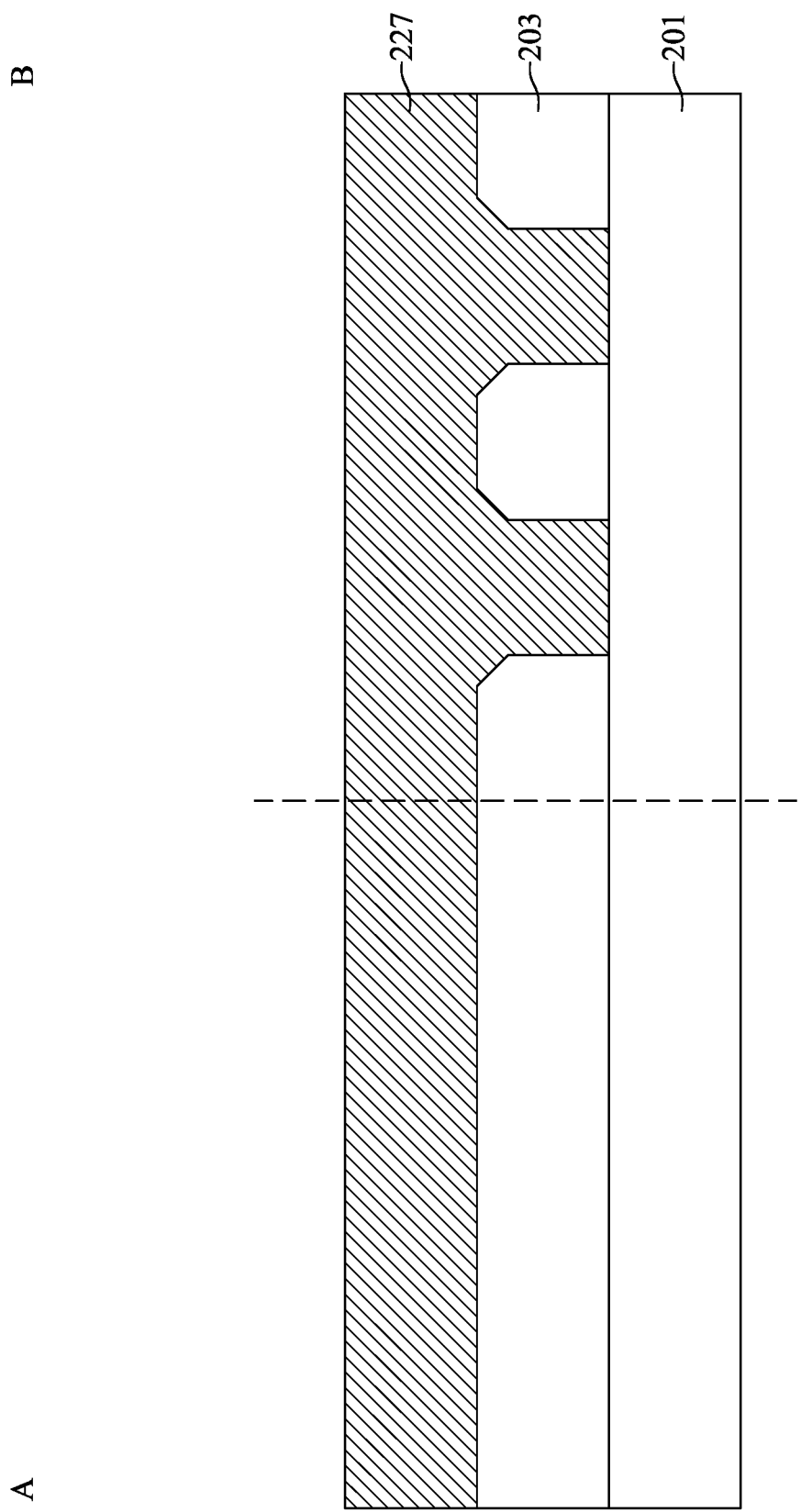
FIG. 16 is a cross-sectional view illustrating an intermediate stage of forming a conductive material in the openings and the recesses and over the first dielectric layer during the formation of the semiconductor device structure according to various embodiments of the present disclosure.

Then, a conductive material 227 is formed in the openings 212a, 212b and the recesses 222a-222d, and over the first dielectric layer 203, as shown in FIG. 16 in accordance with some embodiments. In some embodiments, the conductive material 227 includes copper (Cu), tungsten (W), aluminum (Al), titanium (Ti), tantalum (Ta), gold (Au), silver (Ag), a combination thereof, or another suitable conductive material. The conductive material 227 may be formed by a deposition process, such as a CVD process, a PVD process, an ALD process, a spin-on coating process, another suitable method, or a combination thereof.

Figure 17:
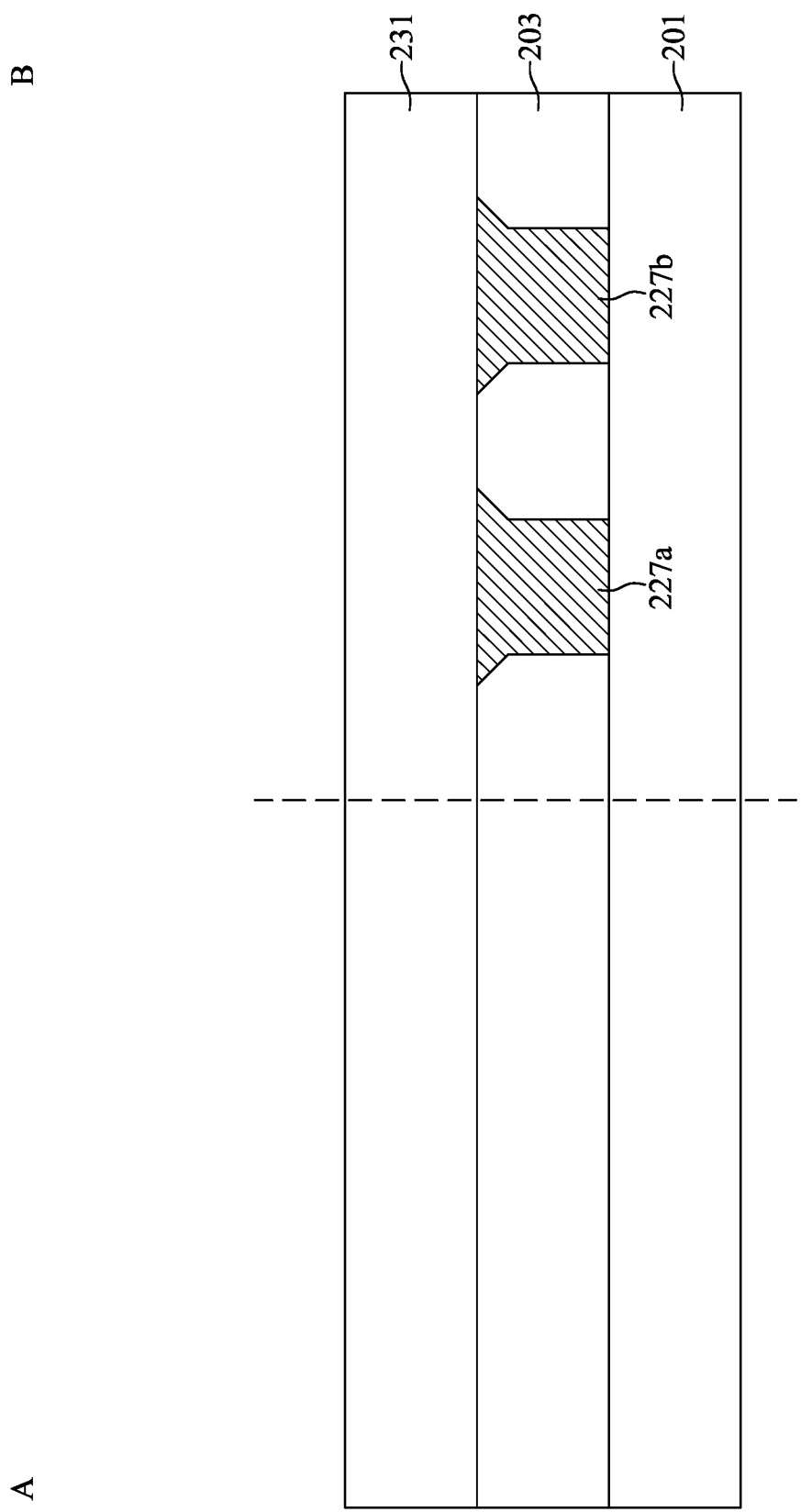
FIG. 17 is a cross-sectional view illustrating an intermediate stage of planarizing the conductive material to form conductive plugs in the first dielectric layer and forming a second dielectric layer over the first dielectric layer during the formation of the semiconductor device structure according to various embodiments of the present disclosure.

Next, a planarization process is performed on the conductive material 227, such that conductive plugs 227a and 227b are formed in the first dielectric layer 203 and in the pattern-dense region B, as shown in FIG. 17 in accordance with some embodiments. In some embodiments, the opening 212a and the recesses 222a, 222b are filled by the conductive plug 227a, and the opening 212b and the recesses 222c, 222d are filled by the conductive plug 227b. The respective step is illustrated as the step S17 in the method 10 shown in FIG. 9.

The planarization process may include a chemical mechanical polishing (CMP) process. After the planarization process, the top surfaces of the conductive plugs 227a and 227b are substantially coplanar with the top surface of the first dielectric layer 203. Within the context of this disclosure, the word "substantially" means preferably at least 90%, more preferably 95%, even more preferably 98%, and most preferably 99%.

After the conductive plugs 227a and 227b are formed, a second dielectric layer 231 is formed over the first dielectric layer 203 and covering the conductive plugs 227a and 227b, in accordance with some embodiments. The respective step is illustrated as the step S19 in the method 10 shown in FIG. 9. Some materials and processes used to form the second dielectric layer 231 are similar to, or the same as those used to form the first dielectric layer 203, and details thereof are not repeated herein.

Figure 18:
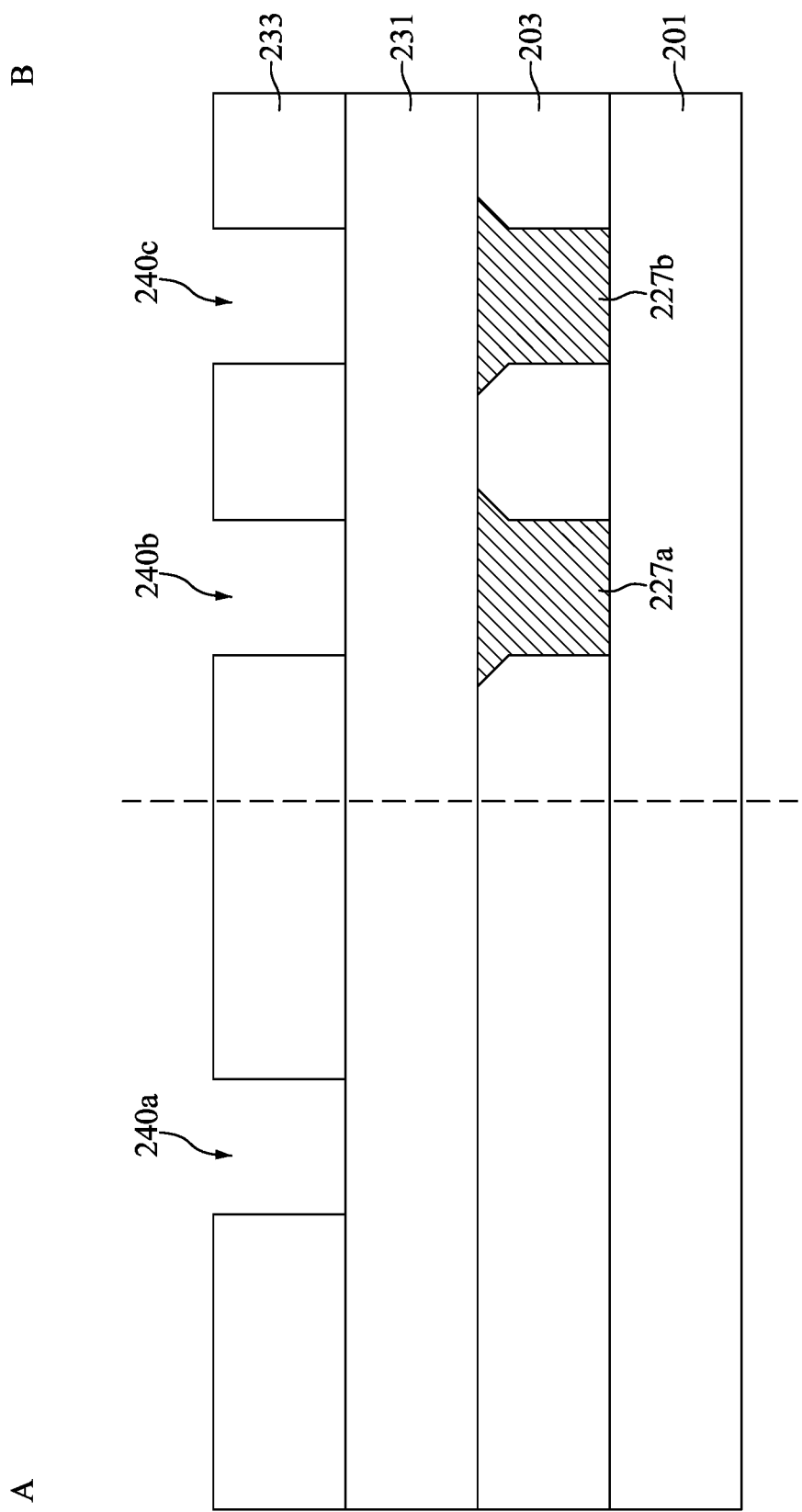
FIG. 18 is a cross-sectional view illustrating an intermediate stage of forming a patterned mask over the second dielectric layer during the formation of the semiconductor device structure according to various embodiments of the present disclosure.

Subsequently, a patterned mask 233 with openings 240a, 240b and 240c is formed over the second dielectric layer 231, as shown in FIG. 18 in accordance with some embodiments. In some embodiments, the opening 240a is located in the pattern-loose region A, and the openings 240b and 240c are located in the pattern-dense region B. In some embodiments, the second dielectric layer 231 is exposed by the openings 240a, 240b and 240c.

Figure 19:
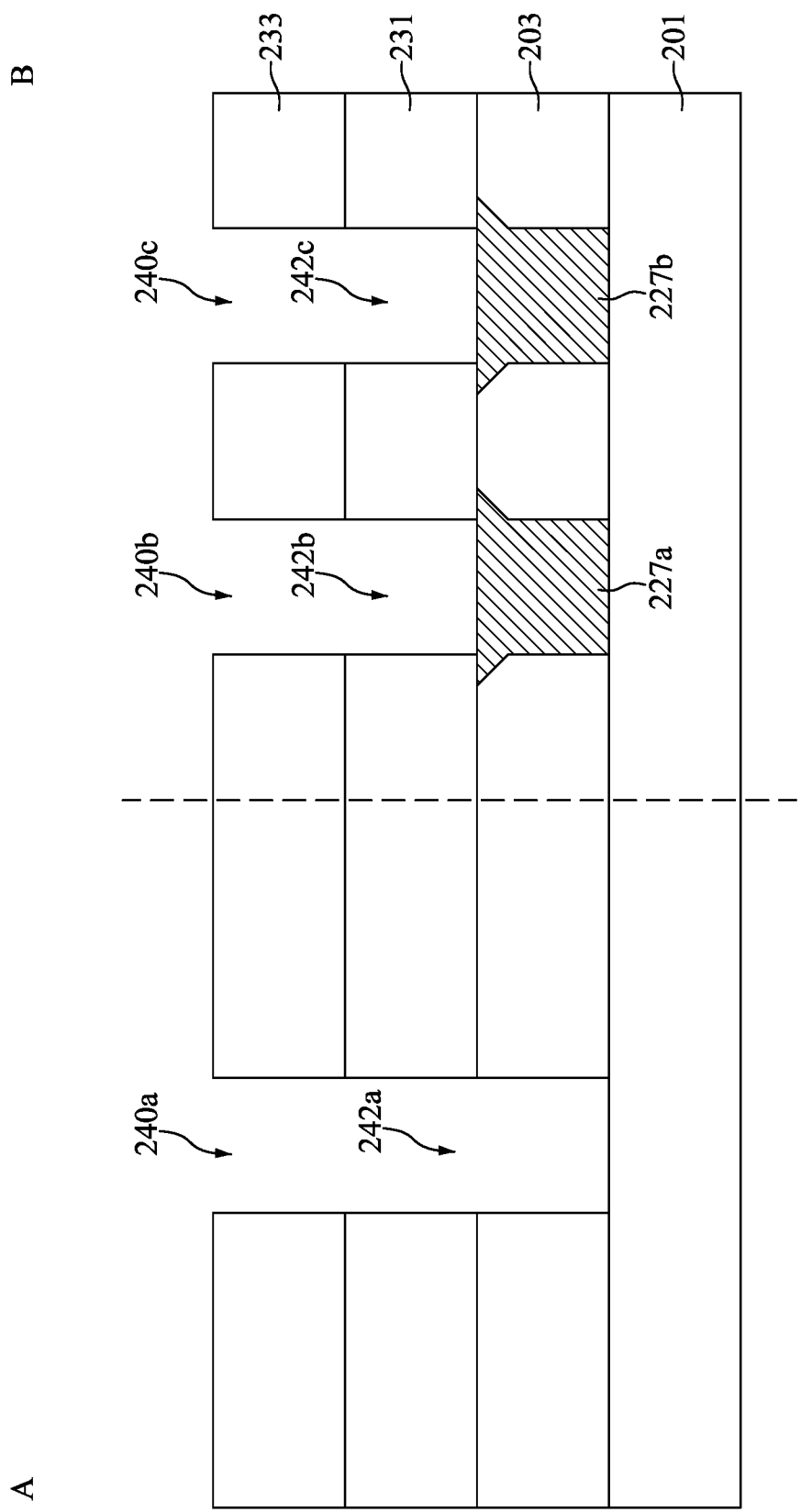
FIG. 19 is a cross-sectional view illustrating an intermediate stage of etching the second dielectric layer to form openings exposing the conductive plugs in the first dielectric layer during the formation of the semiconductor device structure according to various embodiments of the present disclosure.

Then, an etching process is performed using the patterned mask 233 as a mask, such that an opening 242a is formed penetrating through the first dielectric layer 203 and the second dielectric layer 231, and openings 242a and 242c are formed penetrating through the second dielectric layer 231, as shown in FIG. 19 in accordance with some embodiments. In some embodiments, the portion of the semiconductor substrate 201 in the pattern-loose region A is partially exposed by the opening 242a, and the conductive plugs 227a and 227b in the pattern-dense region B are partially exposed by the openings 242b and 242c, respectively. The respective step is illustrated as the step S21 in the method 10 shown in FIG. 9.

In some embodiments, the conductive plugs 227a and 227b serve as etch stops during the etching process. The etching process may be a wet etching process, a dry etching process, and a combination thereof. After the openings 242a, 242b and 242c are formed, the patterned mask 233 may be removed. In some embodiments, the portion of the second dielectric layer 231 in the pattern-loose region A is entirely covered by the patterned mask 233, and the opening 242a is formed in a separate process step than the forming of the openings 242b and 242c.

Figure 20:
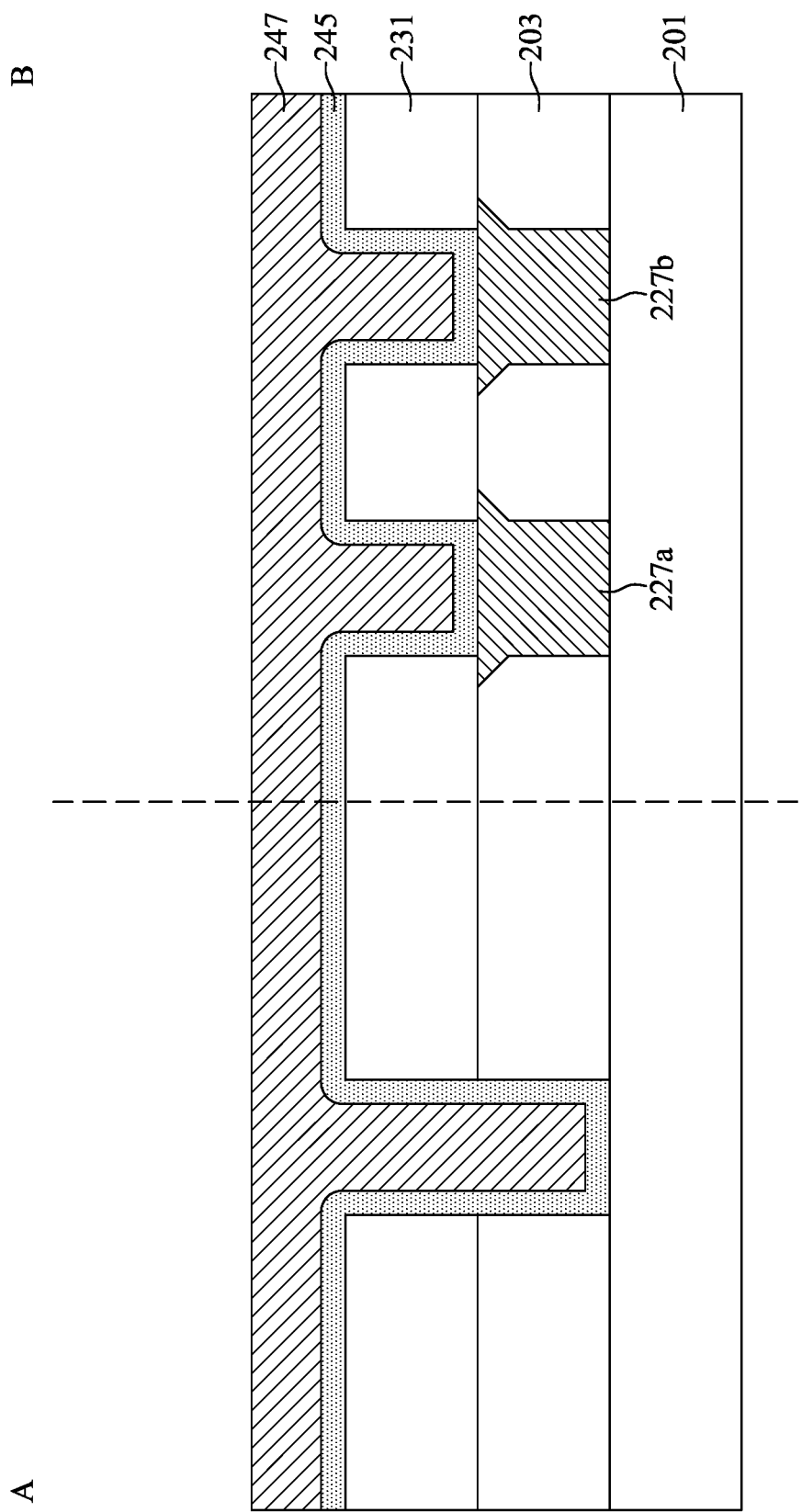
FIG. 20 is a cross-sectional view illustrating an intermediate stage of forming a lining material and a conductive material in the openings in the second dielectric layer and over the second dielectric layer during the formation of the semiconductor device structure according to various embodiments of the present disclosure.

Next, a lining material 245 and a conductive material 247 are sequentially formed in the openings 242a, 242b, 242c and over the second dielectric layer 231, as shown in FIG. 20 in accordance with some embodiments. In some embodiments, the lining material 245 includes titanium (Ti), titanium nitride (TiN), tantalum (Ta), tantalum nitride (TaN), cobalt tungsten (CoW), another applicable material, or a combination thereof, and the lining material 245 is formed by a deposition process, such as a CVD process, a PVD process, an ALD process, a metal organic chemical vapor deposition (MOCVD) process, a sputtering process, a plating process, or another applicable process.

In some embodiments, the conductive material 247 includes copper (Cu), aluminum (Al), tungsten (W), titanium (Ti), tantalum (Ta), gold (Au), silver (Ag), a combination thereof, or another applicable conductive material. Some processes used to form the conductive material 247 are similar to, or the same as those used to form the lining material 245, and details thereof are not repeated herein.

Subsequently, a planarization process is performed on the lining material 245 and the conductive material 247, such that a liner 245a and a conductive plug 247a are formed in the pattern-loose region A, and liners 245b, 245c and conductive plugs 247b, 247c are formed in the pattern-dense region B, as shown in FIG. 3 in accordance with some embodiments. The respective step is illustrated as the step S23 in the method 10 shown in FIG. 9. The planarization process may include a CMP process. After the planarization process is performed, the semiconductor device structure 200a is obtained.

The semiconductor device structure 200b shown in FIG. 5 may be formed using similar processes as the semiconductor device structure 200a. In some embodiments, a lining material (not shown) is formed lining the openings 212a, 212b and the recesses 222a-222d and over the first dielectric layer 203 before the conductive material 227 is formed (see FIGS. 15 and 16), and the lining material is planarized with the conductive material 227 in order to form the liners 225a and 225b in the semiconductor device structure 200b.

Figure 21:
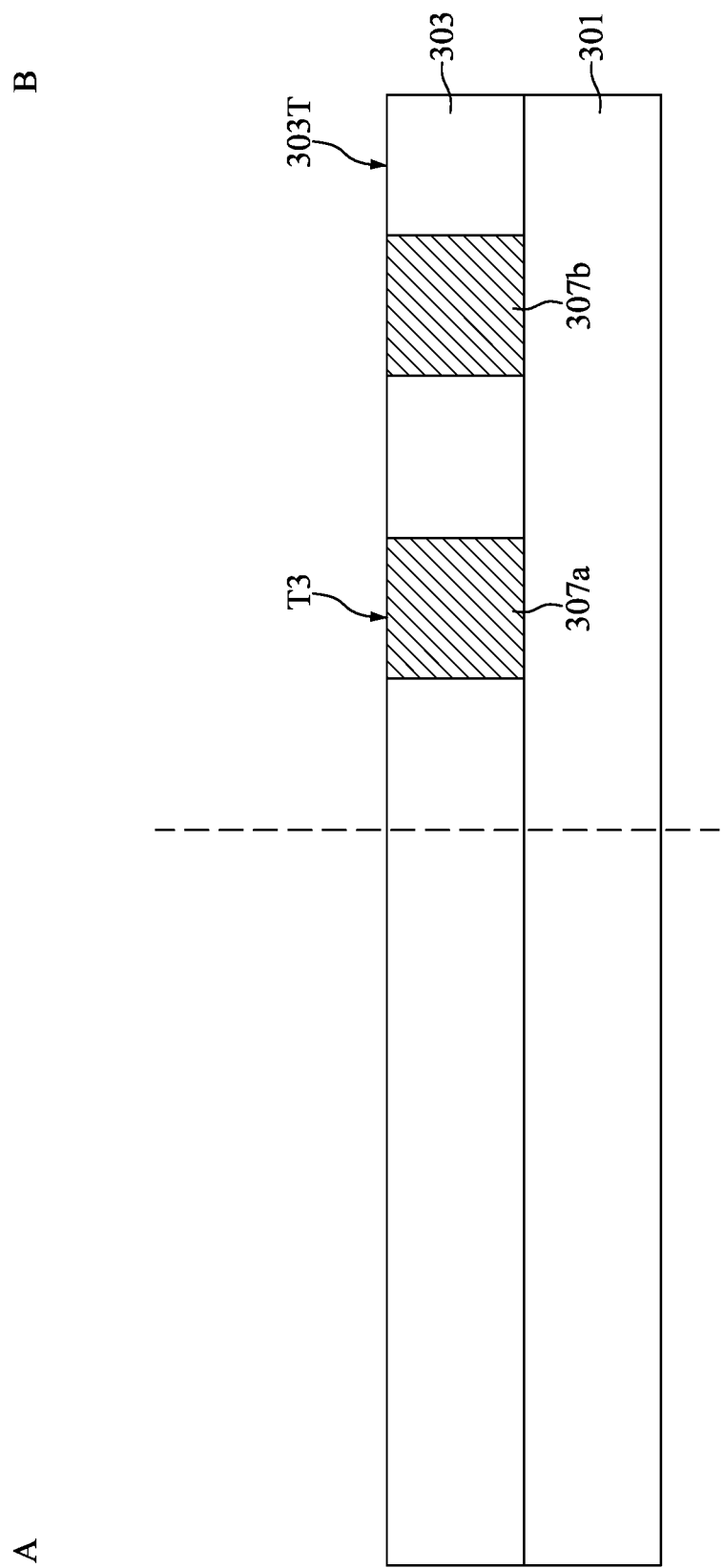
FIG. 21 is a cross-sectional view illustrating an intermediate stage of forming conductive plugs in the first dielectric layer during the formation of the semiconductor device structure according to various embodiments of the present disclosure.

FIGS. 21-26 are cross-sectional views illustrating intermediate stages of forming the semiconductor device structure 300a, in accordance with some embodiments. As shown in FIG. 21, a semiconductor substrate 301 is provided, in accordance with some embodiments. The semiconductor substrate 301 is similar to, or the same as those of the semiconductor substrate 201, and details thereof are not repeated herein.

Still referring to FIG. 21, a first dielectric layer 303 and conductive plugs 307a, 307b are formed over the semiconductor substrate 301, in accordance with some embodiments. In some embodiments, the formation of the first dielectric layer 303 and the conductive plugs 307a and 307b includes forming a first dielectric layer 303 over the semiconductor substrate 301, etching the first dielectric layer 303 to form openings (not shown) partially exposing the portion of the semiconductor substrate 301 in the pattern-dense region B, forming a conductive material (not shown) in the openings and over the first dielectric layer 303, and performing a planarization process on the conductive material to form the conductive plugs 307a and 307b. The respective steps are illustrated as the steps S31-35 in the method 30 shown in FIG. 10.

After the planarization process, the top surfaces of the first dielectric layer and the conductive plugs 307a and 307b are substantially coplanar to each other. For example, the top surface T3 of the conductive plug 307a is substantially coplanar with the top surface 303T of the dielectric layer 303. Some materials used to form the first dielectric layer 303 and the conductive plugs 307a, 307b are similar to, or the same as those used to form the first dielectric layer 203 and the conductive plugs 227a and 227b, and details thereof are not repeated herein.

Figure 22:
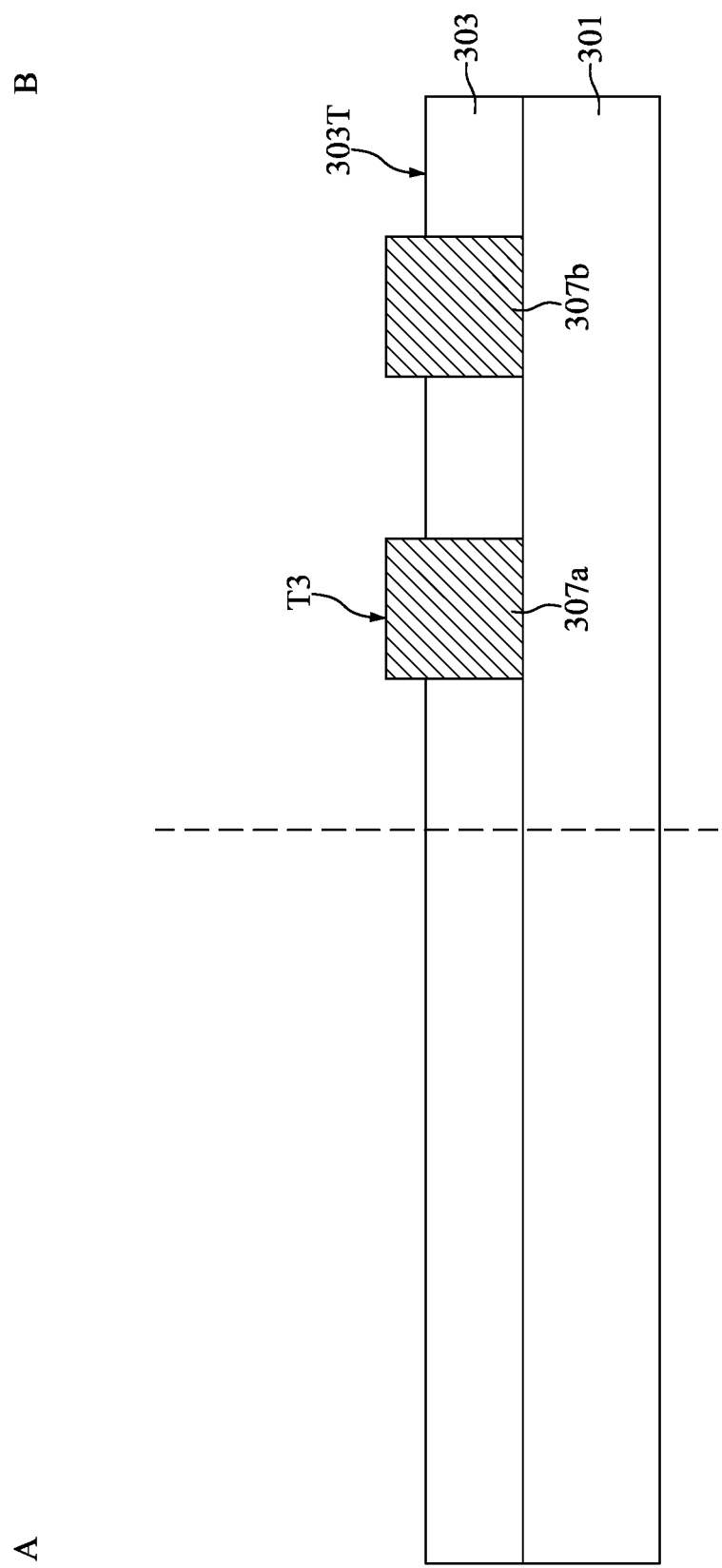
FIG. 22 is a cross-sectional view illustrating an intermediate stage of etching the first dielectric layer such that upper portions of the conductive plugs protrude from the first dielectric layer during the formation of the semiconductor device structure according to various embodiments of the present disclosure.

Next, an etching process is performed on the first dielectric layer 303 such that upper portions of the conductive plugs 307a and 307b protrude from the first dielectric layer 303, as shown in FIG. 22 in accordance with some embodiments. The respective step is illustrated as the step S37 in the method 30 shown in FIG. 10.

In some embodiments, after the etching process, the top surfaces of the conductive plugs 307a, 307b are higher than the top surface of the first dielectric layer 303. For example, the top surface T3 of the conductive plug 307a is higher than the top surface 303T of the first dielectric layer 303. The etching process may be a wet etching process, a dry etching process, and a combination thereof.

Figure 23:
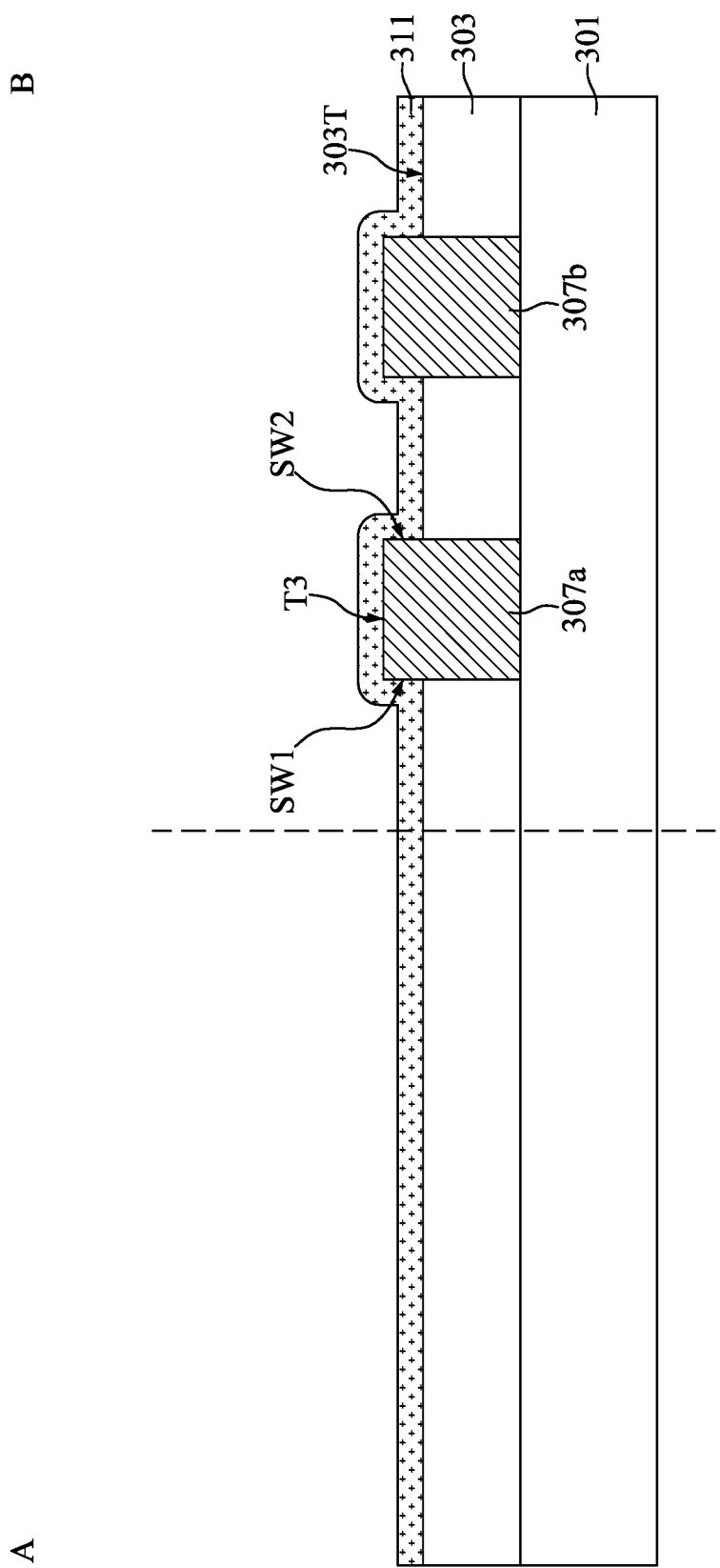
FIG. 23 is a cross-sectional view illustrating an intermediate stage of depositing a polysilicon layer conformally covering the first dielectric layer and the upper portions of the conductive plugs during the formation of the semiconductor device structure according to various embodiments of the present disclosure.

Subsequently, a polysilicon layer 311 is deposited conformally covering the top surface 303T of the first dielectric layer 303 and the upper portions of the conductive plugs 307a, 307b over the top surface 303T of the first dielectric layer 303, as shown in FIG. 23 in accordance with some embodiments. For example, the top surface T3 and the sidewalls SW1, SW2 of the upper portion of the conductive plug 307a are covered by and in direct contact with the polysilicon layer 311. The respective step is illustrated as the step S39 in the method 30 shown in FIG. 10. In some embodiments, the polysilicon layer 311 is deposited by a CVD process, a PVD process, an ALD process, a spin-on coating process, another suitable method, or a combination thereof.

Figure 24:
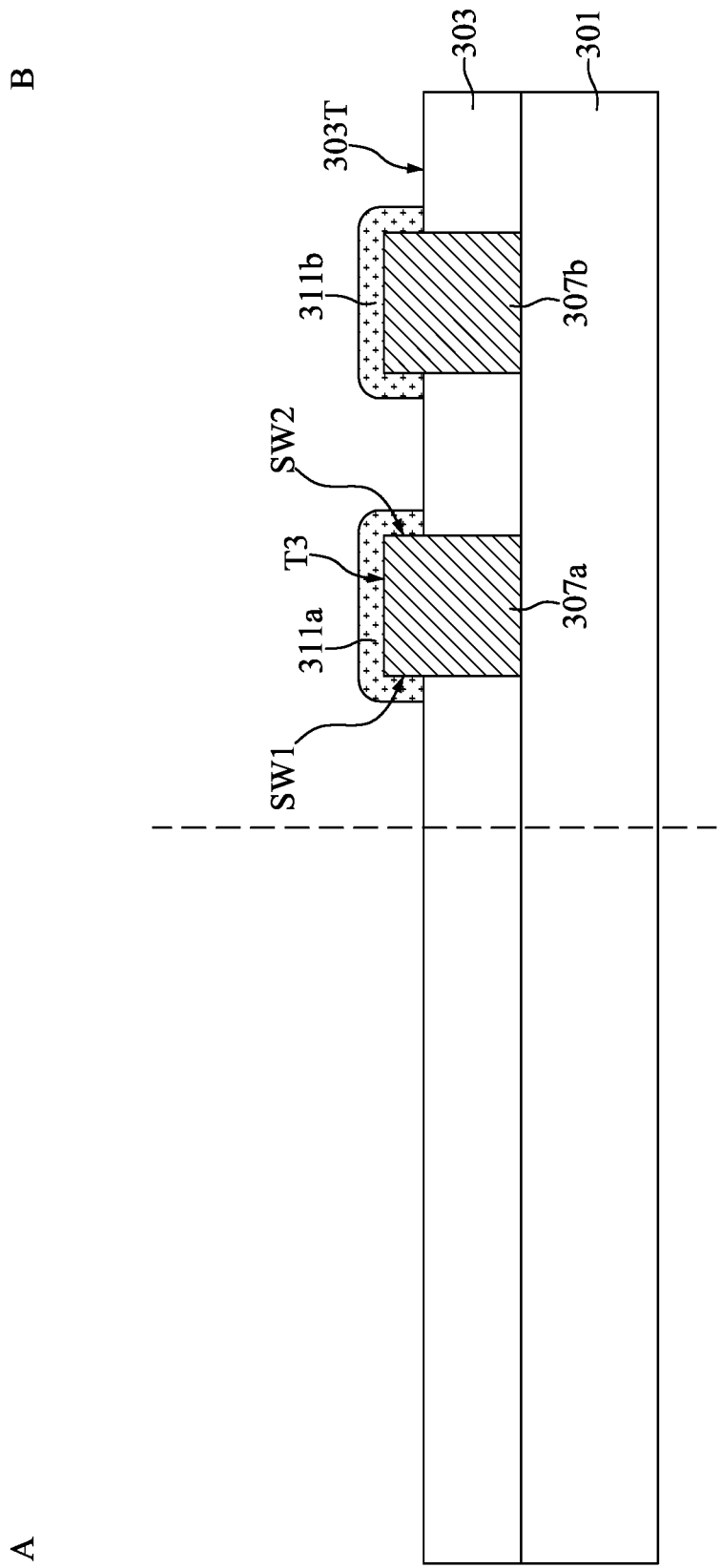
FIG. 24 is a cross-sectional view illustrating an intermediate stage of performing a thermal treatment process to transform portions of the polysilicon layer into silicide layers during the formation of the semiconductor device structure according to various embodiments of the present disclosure.

Then, a thermal treatment process is performed to transform portions of the polysilicon layer 311 into silicide layers 311a and 311b covering the upper portions of the conductive plugs 307a and 307b, and a remaining portion (i.e., the unreacted portion) of the polysilicon layer 311 is removed, as shown in FIG. 24 in accordance with some embodiments. For example, the top surface T3 and the sidewalls SW1, SW2 of the upper portion of the conductive plug 307a are covered by and in direct contact with the silicide layer 311a. The respective step is illustrated as the step S41 in the method 30 shown in FIG. 10. In some embodiments, the remaining portion of the polysilicon layer 311 is removed by an etching process.

Figure 25:
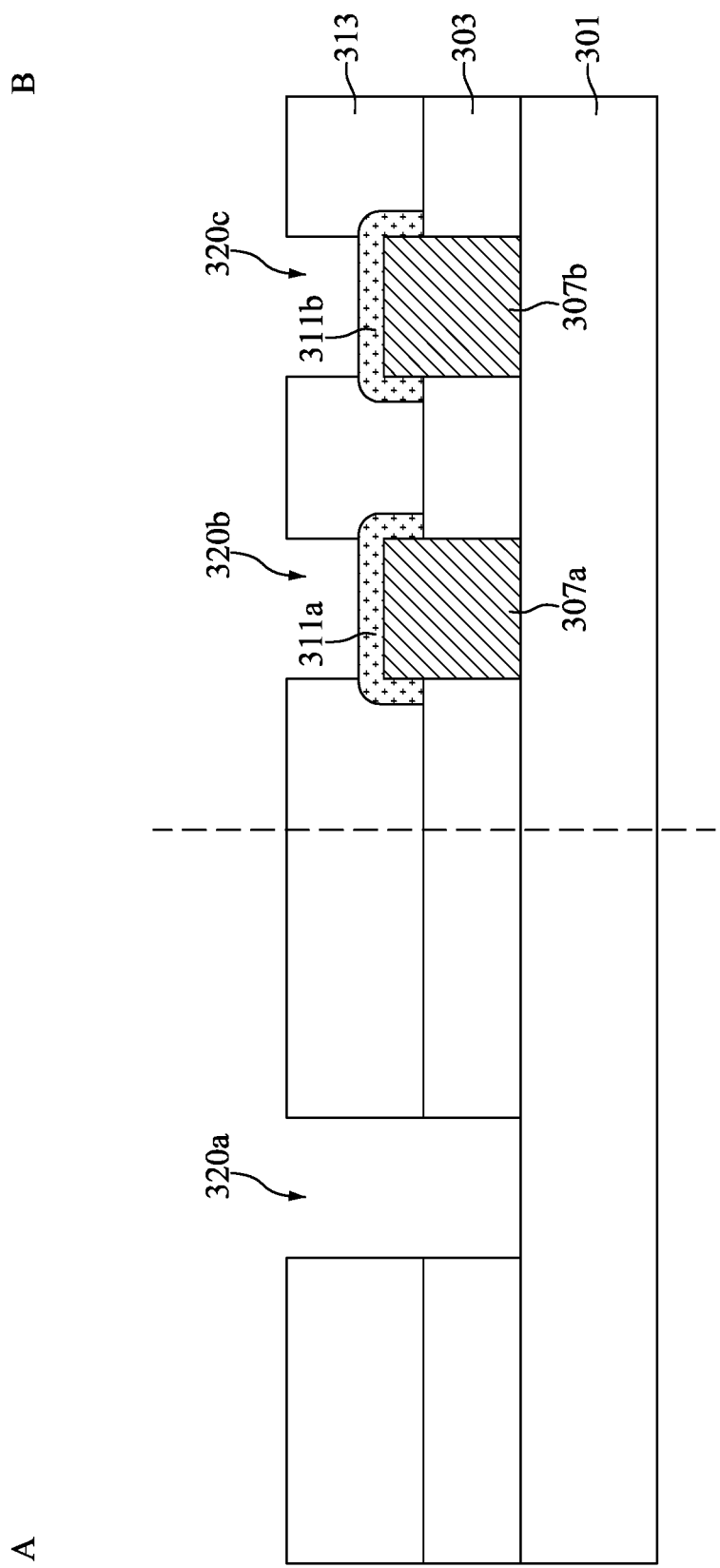
FIG. 25 is a cross-sectional view illustrating an intermediate stage of forming a second dielectric layer and etching the second dielectric layer to form openings exposing the silicide layers during the formation of the semiconductor device structure according to various embodiments of the present disclosure.

Next, a second dielectric layer 313 is formed over the first dielectric layer 303 and covering the silicide layers 311a, 311b, and an etching process is performed on the first dielectric layer 303 and the second dielectric layer 313 to form openings 320a, 320b and 320c, as shown in FIG. 25 in accordance with some embodiments. The respective steps are illustrated as the steps S43-S45 in the method 30 shown in FIG. 10. In some embodiments, the opening 320a is formed penetrating through the first dielectric layer 303 and the second dielectric layer 313, and the openings 320b and 320c are formed penetrating through the second dielectric layer 313.

In some embodiments, the portion of the semiconductor substrate 301 in the pattern-loose region A is partially exposed by the opening 320a, and the silicide layers 311a and 311b in the pattern-dense region B are partially exposed by the openings 320b and 320c, respectively. In some embodiments, the silicide layers 311a and 311b serve as etch stops during the etching process. The etching process may be a wet etching process, a dry etching process, and a combination thereof. In some embodiments, the opening 320a is formed in a separate process step than the forming of the openings 320b and 320c.

Figure 26:
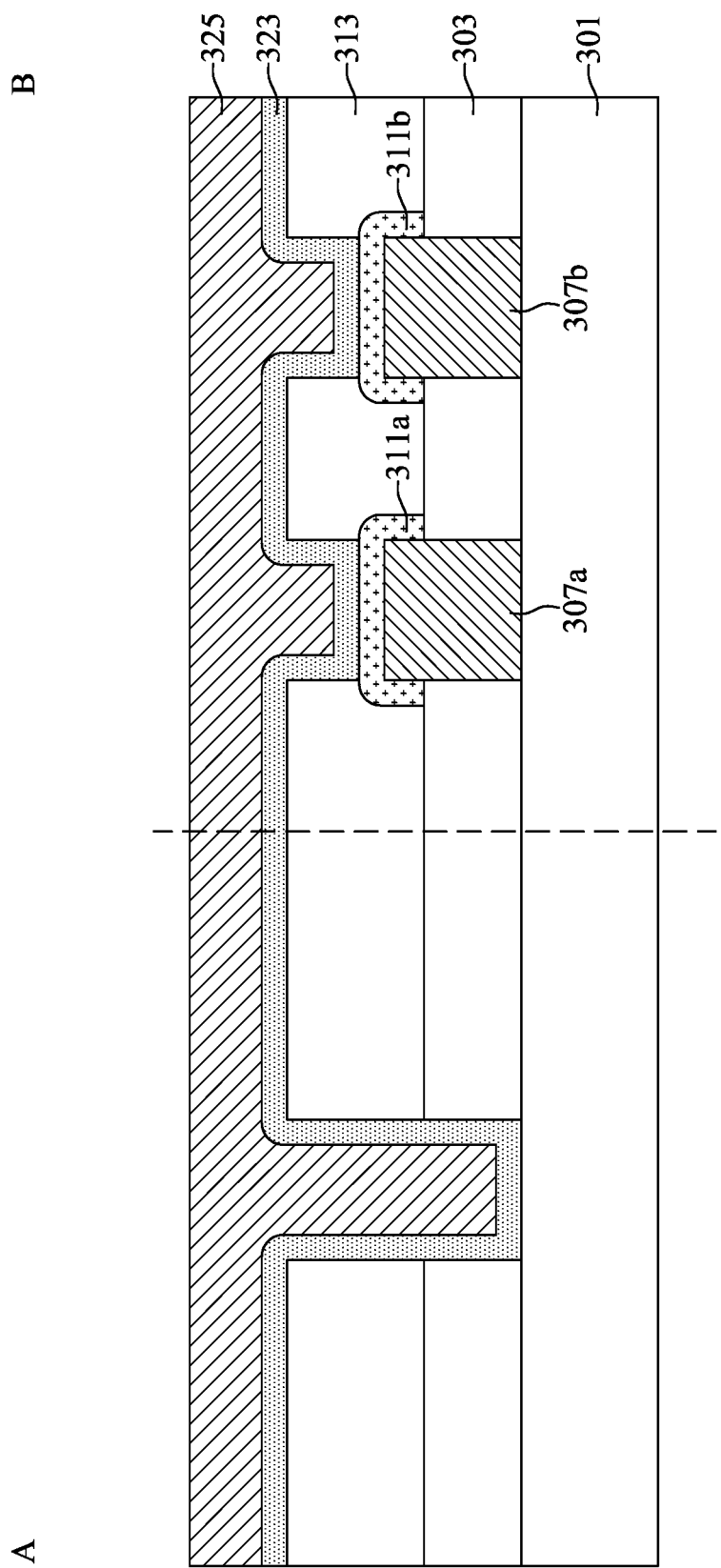
FIG. 26 is a cross-sectional view illustrating an intermediate stage of forming a lining material and a conductive material in the openings in the second dielectric layer and over the second dielectric layer during the formation of the semiconductor device structure according to various embodiments of the present disclosure.

Subsequently, a lining material 323 and a conductive material 325 are sequentially formed in the openings 320a, 320b, 320c and over the second dielectric layer 313, as shown in FIG. 26 in accordance with some embodiments. Some materials and processes used to form the lining material 323 and the conductive material 325 are similar to, or the same as those used to form the lining material 245 and the conductive material 247, and details thereof are not repeated herein. It should be noted that the lining material 323 is separated from the conductive plugs 307a and 307b by the silicide layers 311a and 311b, in accordance with some embodiments.

Then, a planarization process is performed on the lining material 323 and the conductive material 325, such that a liner 323a and a conductive plug 325a are formed in the pattern-loose region A, and liners 323b, 323c and conductive plugs 325b, 325c are formed in the pattern-dense region B, as shown in FIG. 7 in accordance with some embodiments. The respective step is illustrated as the step S47 in the method 30 shown in FIG. 10. The planarization process may include a CMP process. After the planarization process is performed, the semiconductor device structure 300a is obtained.

The semiconductor device structure 300b shown in FIG. 8 may be formed using similar processes as the semiconductor device structure 300a. Some processes used to form the liners 305a and 305b of the semiconductor device structure 300b are similar to, or the same as those used to form the liners 225a and 225b in the semiconductor device structure 200b, and details thereof are not repeated herein.

Figure 27:
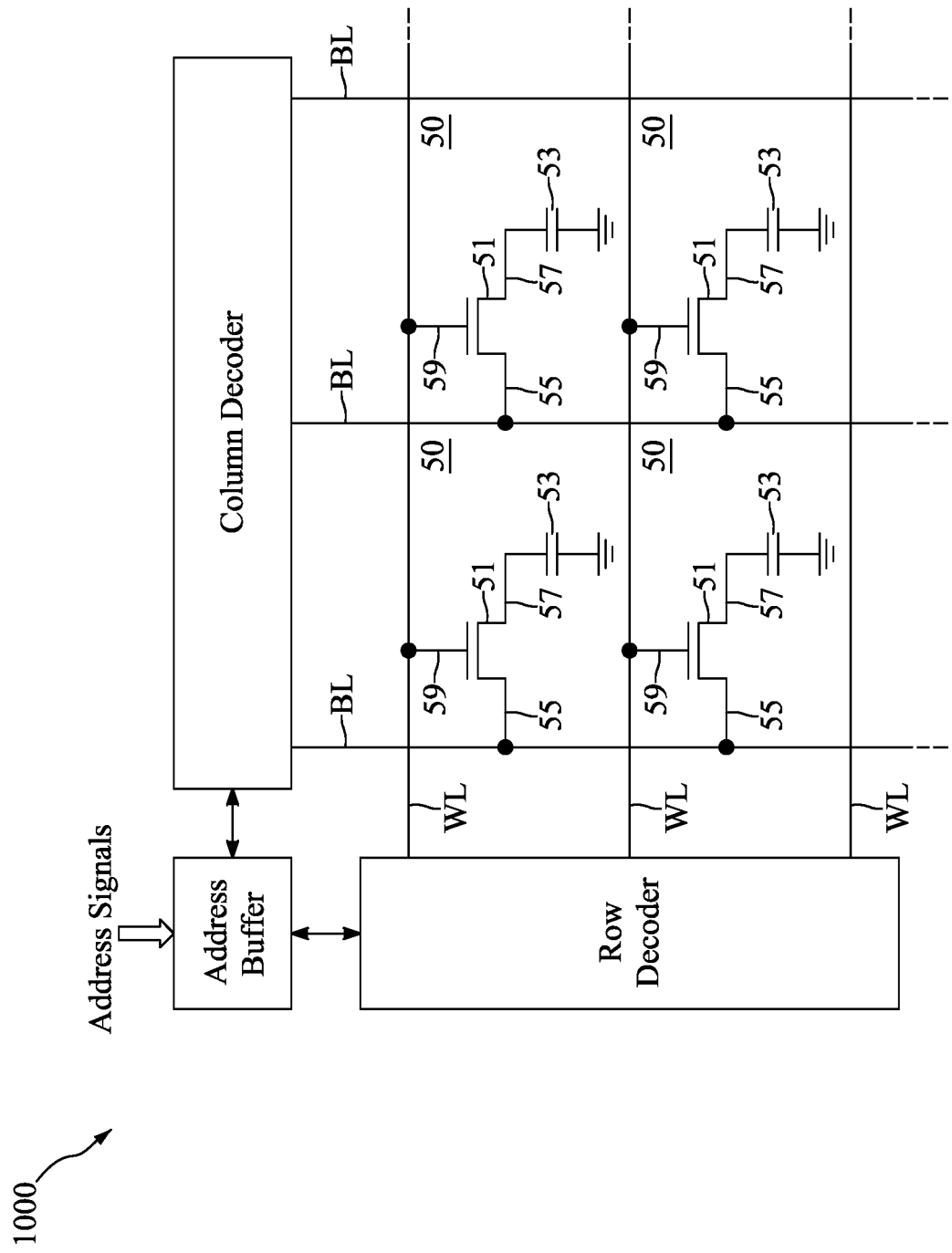
FIG. 27 is a partial schematic illustration of an exemplary integrated circuit, including an array of memory cells in accordance with some embodiments.

FIG. 27 is a partial schematic illustration of an exemplary integrated circuit, such as a memory device 1000, including an array of memory cells 50 according to various embodiments of the present disclosure. In some embodiments, the memory device 1000 includes a DRAM. In some embodiments, the memory device 1000 includes a number of memory cells 50 arranged in a grid pattern and including a number of rows and columns. The number of memory cells 50 may vary depending on system requirements and fabrication technology.

In some embodiments, each of the memory cells 50 includes an access device and a storage device. The access device is configured to provide controlled access to the storage device. In particular, the access device is a field effect transistor (FET) 51 and the storage device is a capacitor 53, in accordance with some embodiments. In each of the memory cells 50, the FET 51 includes a drain 55, a source 57 and a gate 59. One terminal of the capacitor 53 is electrically connected to the source 57 of the FET 51, and the other terminal of the capacitor 53 may be electrically connected to the ground. In addition, in each of the memory cells 50, the gate 59 of the FET 51 is electrically connected to a word line WL, and the drain 55 of the FET 51 is electrically connected to a bit line BL.

The above description mentions the terminal of the FET 51 electrically connected to the capacitor 53 is the source 57, and the terminal of the FET 51 electrically connected to the bit line BL is the drain 55. However, during read and write operations, the terminal of the FET 51 electrically connected to the capacitor 53 may be the drain, and the terminal of the FET 51 electrically connected to the bit line BL may be the source. That is, either terminal of the FET 51 could be a source or a drain depending on the manner in which the FET 51 is being controlled by the voltages applied to the source, the drain and the gate.

By controlling the voltage at the gate 59 via the word line WL, a voltage potential may be created across the FET 30 such that the electrical charge can flow from the drain 55 to the capacitor 53. Therefore, the electrical charge stored in the capacitor 53 may be interpreted as a binary data value in the memory cell 30. For example, a positive charge above a threshold voltage stored in the capacitor 53 may be interpreted as binary "1." If the charge in the capacitor 53 is below the threshold value, a binary value of "0" is said to be stored in the memory cell 30.

The bit lines BL are configured to read and write data to and from the memory cells 50. The word lines WL are configured to activate the FET 51 to access a particular row of the memory cells 50. Accordingly, the memory device 1000 also includes a periphery circuit region which may include an address buffer, a row decoder and a column decoder. The row decoder and the column decoder selectively access the memory cells 50 in response to address signals that are provided to the address buffer during read, write and refresh operations. The address signals are typically provided by an external controller such as a microprocessor or another type of memory controller.

Referring back to FIGS. 3, 5, 7 and 8, the conductive plugs 247a and 325a are formed in the pattern-loose region A, while the conductive plugs 247b, 247c, 325b, 325c are formed in the pattern-dense region B. The pattern-loose region A may be any of the regions of the address buffer, the row decoder, or the column decoder in the memory device 1000, and the pattern-dense region B may be any of the regions of the memory cells 50 in the memory device 1000.

Embodiments of the semiconductor device structures 200a and 200b and method for preparing the same are provided in the disclosure. In some embodiments, each of the semiconductor device structures 200a and 200b includes a first conductive plug (e.g., the conductive plug 227a) and a second conductive plug (e.g., the conductive plug 247b) directly over the first conductive plug, and a top surface of the first conductive plug is greater than a bottom surface of the first conductive plug. The aforementioned stacked conductive plugs can help to eliminate the problems of having overhang resulting from the difficulties in filling a high aspect ratio opening structure.

Moreover, the greater top surface of the first conductive plug increases the landing area for the second conductive plug. Therefore, the possibility of gap formation between the conductive plugs and the surrounding dielectric layers (e.g., the first dielectric layer 203 and the second dielectric layer 231) can be reduced, and the risk of misalignment between the first conductive plug and the second conductive plug can be prevented. As a result, the performance, reliability and yield of the semiconductor device structures 200a and 200b can be improved.

Embodiments of the semiconductor device structures 300a and 300b and method for preparing the same are provided in the disclosure. In some embodiments, each of the semiconductor device structures 300a and 300b includes a first conductive plug (e.g., the conductive plug 307a), a silicide layer (e.g., the silicide layer 311a) covering a top surface and sidewalls of an upper portion of the first conductive plug, and a second conductive plug (e.g., the conductive plug 325b) directly over the first conductive plug and the silicide layer. The aforementioned stacked conductive plugs can help to eliminate the problems of having overhang resulting from the difficulties in filling a high aspect ratio opening structure.

In addition, the silicide layer disposed over the first conductive plug increases the landing area for the second conductive plug. Therefore, the possibility of gap formation between the conductive plugs and the surrounding dielectric layers (e.g., the first dielectric layer 303 and the second dielectric layer 313) can be reduced, and the risk of misalignment between the first conductive plug and the second conductive plug can be prevented. As a result, the performance, reliability and yield of the semiconductor device structures 300a and 300b can be improved.

In one embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a first conductive plug disposed in the first dielectric layer. A top surface of the first conductive plug is greater than a bottom surface of the first conductive plug. The semiconductor device structure further includes a second conductive plug disposed in the second dielectric layer and directly over the first conductive plug.

In another embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a first conductive plug disposed in the first dielectric layer. An upper portion of the first conductive plug extends into the second dielectric layer. The semiconductor device structure further includes a silicide layer disposed in the second dielectric layer and covering a top surface and sidewalls of the upper portion of the first conductive plug, and a second conductive plug disposed in the second dielectric layer and directly over the first conductive plug and the silicide layer.

In another embodiment of the present disclosure, a method for preparing a semiconductor device structure is provided. The method includes forming a first dielectric layer over a semiconductor substrate, and etching the first dielectric layer to form a first opening exposing the semiconductor substrate. The method also includes forming recesses by removing portions of the first dielectric layer at top corners of the first opening, and forming a first conductive plug in the first opening and the recesses. The method further includes forming a second dielectric layer over the first dielectric layer, and etching the second dielectric layer to form a second opening exposing the first conductive plug. In addition, the method includes forming a second conductive plug in the second opening.

In yet another embodiment of the present disclosure, a method for preparing a semiconductor device structure is provided. The method includes forming a first dielectric layer over a semiconductor substrate, and etching the first dielectric layer to form a first opening exposing the semiconductor substrate. The method also includes forming a first conductive plug in the first opening, and etching the first dielectric layer such that an upper portion of the first conductive plug protrudes from a top surface of the first dielectric layer. The method further includes forming a silicide layer covering a top surface and sidewalls of the upper portion of the first conductive plug, and forming a second dielectric layer over the first dielectric layer. In addition, the method includes etching the second dielectric layer to form a second opening exposing the silicide layer, and forming a second conductive plug in the second opening.

The embodiments of the present disclosure have some advantageous features. In some embodiments, the semiconductor device structure includes a first conductive plug and a second conductive plug directly over the first conductive plug, and a top surface of the first conductive plug is greater than a bottom surface of the first conductive plug. The aforementioned stacked conductive plugs can help to eliminate the problems of having overhang resulting from the difficulties in filling a high aspect ratio opening structure. In addition, the greater top surface of the first conductive plug increases the landing area for the second conductive plug. Therefore, the possibility of gap formation between the conductive plugs and the surrounding dielectric layers can be reduced, and the risk of misalignment between the first conductive plug and the second conductive plug can be prevented. As a result, the performance, reliability and yield of the semiconductor device structure can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device structure, comprising:
    forming a first dielectric layer over and in contact with a top surface of a semiconductor substrate;
    etching the first dielectric layer to form a first opening exposing the top surface of the semiconductor substrate, wherein the first opening is formed through the first dielectric layer from a top surface thereof to the top surface of the semiconductor substrate, such that a depth of the first opening is equal to a thickness of the first dielectric layer;
    forming recesses by removing portions of the first dielectric layer at top corners of the first opening;
    forming a first conductive plug in the first opening and the recesses, wherein a top surface of the first conductive plug is coplanar with a top surface of the first dielectric layer;
    forming a second dielectric layer over the first dielectric layer to cover the top surface of the first conductive plug;
    etching the second dielectric layer to form a second opening exposing the top surface of the first conductive plug; and
    forming a second conductive plug in the second opening.

2. The method for preparing a semiconductor device structure of claim 1, wherein the forming the recesses further comprises:
    forming a patterned mask over the first dielectric layer, wherein the first opening and the top surface of the first dielectric layer around the first opening are exposed by the patterned mask; and
    etching the first dielectric layer using the patterned mask as a mask such that the recesses are formed connected to the first opening.

3. The method for preparing a semiconductor device structure of claim 1, wherein the first conductive plug has lateral extension portions formed in the recesses, and each of the lateral extension portions has a tapered width that is gradually tapered from the second dielectric layer to the semiconductor substrate, wherein a bottom surface of the first conductive plug is in contact with the top surface of the semiconductor substrate.

4. The method for preparing a semiconductor device structure of claim 3, wherein at least a portion of the lateral extension portions of the first conductive plug is covered by the second dielectric layer after the second opening is formed.

5. The method for preparing a semiconductor device structure of claim 1, further comprising:
    forming a first liner lining in the recesses and the first opening; and
    forming the first conductive plug over the first liner;
    wherein a top surface of the first liner is coplanar with the top surface of the top surface of the first conductive plug and the top surface of the first dielectric layer.

6. The method for preparing a semiconductor device structure of claim 1, further comprising:
    forming a second liner lining the second opening; and
    forming the second conducive plug over the second liner, wherein the second conducive plug is separated from the first conductive plug and the second dielectric layer by the second liner;
    wherein the second liner is in contact with the top surface of the first conductive plug;
    wherein at least a portion of the recess is covered by the second liner.

7. The method for preparing a semiconductor device structure of claim 1, further comprising:
    forming a third opening penetrating through the first dielectric layer and the second dielectric layer;
    forming a third liner lining the third opening; and
    forming a third conductive plug in the third opening and over the third liner, wherein the first conductive plug and the second conductive plug are formed in a pattern-dense region, and the third conductive plug is formed in a pattern-loose region.

8. The method for preparing a semiconductor device structure of claim 1, wherein a width of the first opening is equal to a width of the second opening.

9. The method for preparing a semiconductor device structure of claim 1, wherein the first opening has a uniform width before the recesses are formed.

* * * * *